(12) United States Patent
Huang et al.

(10) Patent No.: US 10,790,254 B2
(45) Date of Patent: Sep. 29, 2020

(54) CHIP PACKAGE STRUCTURE

(71) Applicant: Taiwan Semiconductor Manufacturing Co., Ltd., Hsinchu (TW)

(72) Inventors: Kuan-Yu Huang, Taipei (TW); Sung-Hui Huang, Dongshan Township, Yilan County (TW); Shu-Chia Hsu, Hsinchu (TW); Leu-Jen Chen, Taipei (TW); Yi-Wei Liu, Taichung (TW); Shang-Yun Hou, Jubei (TW); Jui-Hsieh Lai, Taoyuan County (TW); Tsung-Yu Chen, Hsinchu (TW); Chien-Yuan Huang, Hsinchu (TW); Yu-Wei Chen, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/277,806

(22) Filed: Feb. 15, 2019

(65) Prior Publication Data

US 2019/0348386 A1 Nov. 14, 2019

Related U.S. Application Data

(60) Provisional application No. 62/669,045, filed on May 9, 2018.

(51) Int. Cl.
*H01L 29/40* (2006.01)
*H01L 21/44* (2006.01)
(Continued)

(52) U.S. Cl.
CPC ............ *H01L 24/17* (2013.01); *H01L 21/563* (2013.01); *H01L 21/565* (2013.01);
(Continued)

(58) Field of Classification Search
CPC .................. H01L 24/17; H01L 2924/3511
(Continued)

(56) References Cited

U.S. PATENT DOCUMENTS 8,884,431 B2 * 11/2014 Lin .................. H01L 23/49816
257/686
8,993,380 B2 3/2015 Hou et al.
(Continued)

*Primary Examiner* — Calvin Lee
(74) *Attorney, Agent, or Firm* — Birch, Stewart, Kolasch & Birch, LLP

(57) ABSTRACT

A chip package structure is provided. The chip package structure includes a substrate having a first surface and a second surface opposite to the first surface. The chip package structure includes a first chip structure and a second chip structure over the first surface. The chip package structure includes a protective layer over the first surface and surrounding the first chip structure and the second chip structure. A portion of the protective layer is between the first chip structure and the second chip structure. The chip package structure includes a first anti-warpage bump over the second surface and extending across the portion of the protective layer. The chip package structure includes a conductive bump over the second surface and electrically connected to the first chip structure or the second chip structure. The first anti-warpage bump is wider than the conductive bump.

20 Claims, 24 Drawing Sheets

(51) Int. Cl.
*H01L 23/00* (2006.01)
*H01L 21/56* (2006.01)
*H01L 23/522* (2006.01)

(52) U.S. Cl.
CPC .............. *H01L 23/5226* (2013.01); *H01L 2224/02371* (2013.01); *H01L 2924/3511* (2013.01)

(58) Field of Classification Search
USPC ................................ 438/666–669; 257/773
See application file for complete search history.

(56) References Cited

U.S. PATENT DOCUMENTS

| | | | |
|---|---|---|---|
| 9,048,233 B2 * | 6/2015 | Wu | H01L 24/11 |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,559,088 B2 * | 1/2017 | Gonzalez | H01L 23/5389 438/107 |
| 9,666,502 B2 * | 5/2017 | Chen | H01L 21/486 |
| 9,735,131 B2 | 8/2017 | Su et al. | |

* cited by examiner

CHIP PACKAGE STRUCTURE

PRIORITY CLAIM AND CROSS-REFERENCE

This application claims the benefit of U.S. Provisional Application No. 62/669,045, filed on May 9, 2018, the entirety of which is incorporated by reference herein.

BACKGROUND

Semiconductor devices are used in a variety of electronic applications, such as personal computers, cell phones, digital cameras, and other electronic equipment. These semiconductor devices are fabricated by sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allow more components to be integrated into a given area. These smaller electronic components also use a smaller package that takes up less area or has a lower height, in some applications.

New packaging technologies have been developed to improve the density and functionality of semiconductor devices. These relatively new types of packaging technologies for semiconductor devices face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
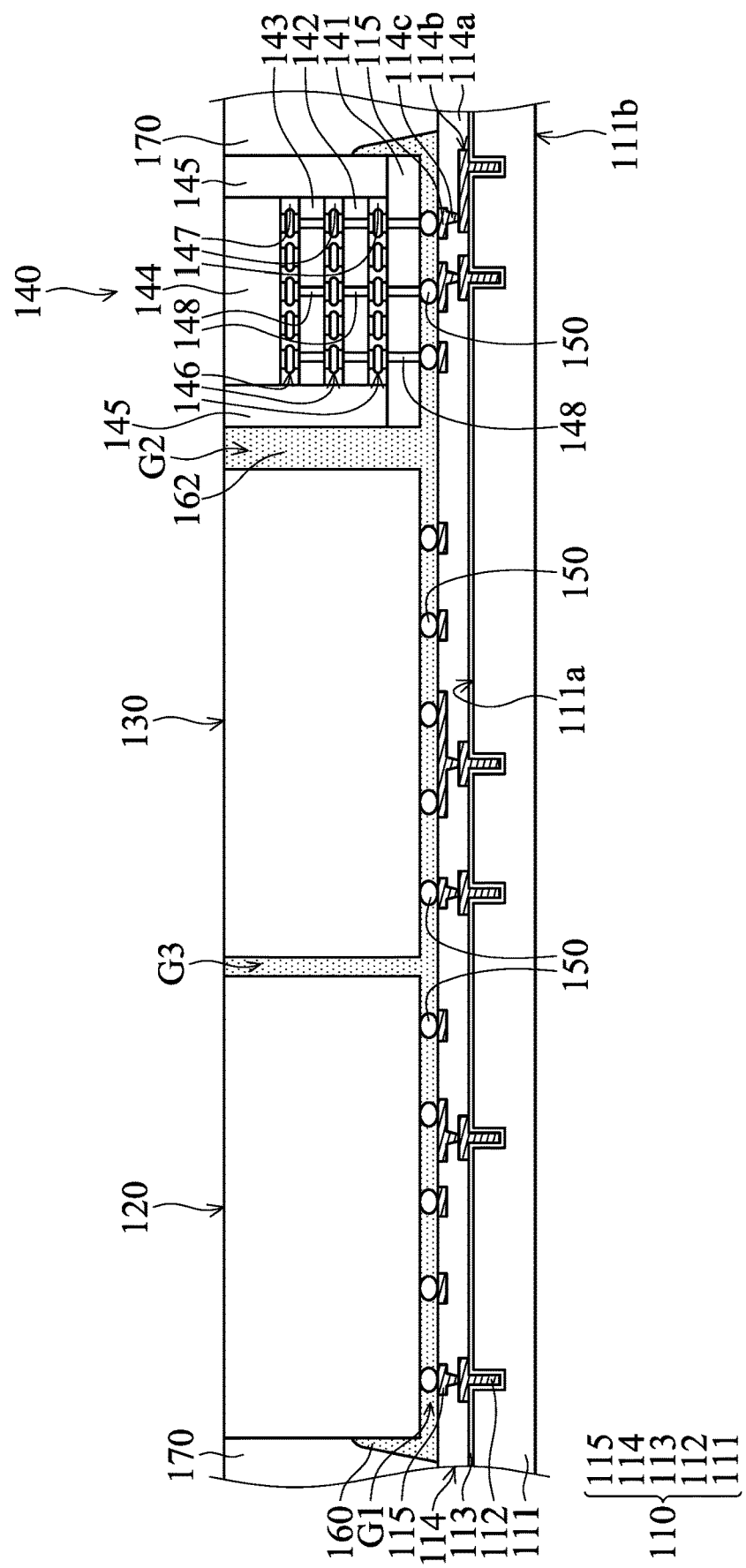
FIGS. 1A-1E are cross-sectional views of various stages of a process for forming a chip package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

This disclosure involves 3D packaging or 3DIC devices. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1E are cross-sectional views of various stages of a process for forming a chip package structure, in accordance with some embodiments. As shown in FIG. 1A, a substrate 110 is provided, in accordance with some embodiments. In some embodiments, the substrate 110 is a wafer. The substrate 110 includes a semiconductor structure 111, conductive vias 112, an insulating layer 113, a redistribution structure 114, and conductive pads 115, in accordance with some embodiments.

The semiconductor structure 111 has surfaces 111a and 111b, in accordance with some embodiments. In some embodiments, the semiconductor structure 111 is made of an elementary semiconductor material including silicon or germanium in a single crystal, polycrystal, or amorphous structure.

In some other embodiments, the semiconductor structure 111 is made of a compound semiconductor (e.g., silicon carbide, gallium arsenide, gallium phosphide, indium phosphide, or indium arsenide), an alloy semiconductor (e.g., SiGe or GaAsP), or a combination thereof. The semiconductor structure 111 may also include multi-layer semiconductors, semiconductor on insulator (SOI) (such as silicon on insulator or germanium on insulator), or a combination thereof.

In some embodiments, the substrate 110 is an interposer wafer. The conductive vias 112 are formed in the semiconductor structure 111, in accordance with some embodiments. The conductive vias 112 may be formed to extend from the surface 111a into the semiconductor structure 111.

The insulating layer 113 is formed over the semiconductor structure 111, in accordance with some embodiments. The insulating layer 113 is between the conductive vias 112 and the semiconductor structure 111, in accordance with some embodiments. The insulating layer 113 is configured to electrically insulate the conductive vias 112 from the semiconductor structure 111, in accordance with some embodiments. The insulating layer 113 is made of an oxide-containing material such as silicon oxide, in accordance with some embodiments. The insulating layer 113 is formed using an oxidation process, a deposition process, or another suitable process.

In some other embodiments, the substrate 110 is a device wafer that includes active devices or circuits. The active devices may include transistors (not shown) formed at the surface 111a. The substrate 110 may also include passive devices (not shown) formed in or over the semiconductor structure 111, in accordance with some embodiments. The passive devices include resistors, capacitors, or other suitable passive devices.

The redistribution structure 114 is formed over the semiconductor structure 111, in accordance with some embodiments. The conductive pads 115 are formed over the redistribution structure 114, in accordance with some embodiments. The redistribution structure 114 includes a dielectric layer 114a, wiring layers 114b, and conductive vias 114c, in accordance with some embodiments. The dielectric layer 114a is formed over the surface 111a, in accordance with some embodiments. The wiring layers 114b are formed in the dielectric layer 114a, in accordance with some embodiments.

As shown in FIG. 1A, the conductive vias 114c are electrically connected between different wiring layers 114b and between the wiring layer 114b and the conductive pads 115, in accordance with some embodiments. For the sake of simplicity, FIG. 1A only shows one of the wiring layers 114b, in accordance with some embodiments. The conductive vias 112 are electrically connected to the conductive pads 115 through the wiring layers 114b and the conductive vias 114c, in accordance with some embodiments.

As shown in FIG. 1A, the chip structures 120, 130, and 140 are bonded to the substrate 110 through the conductive bumps 150 between the chip structures 120, 130 and 140 and the substrate 110, in accordance with some embodiments. The chip structure 120 or 130 includes a chip, such as a system on chip (SoC), in accordance with some embodiments. In some other embodiments, the chip structure 120 or 130 includes a chip package structure.

In some embodiments, the chip structure 140 includes multiple semiconductor dies. As shown in FIG. 1A, the chip structure 140 includes semiconductor dies 141, 142, 143, and 144, in accordance with some embodiments. In some embodiments, the chip structure 140 includes a molding layer 145 that encapsulates and protects the semiconductor dies 142, 143 and 144. The molding layer 145 may include an epoxy-based resin with fillers dispersed therein. The fillers may include insulating fibers, insulating particles, other suitable elements, or a combination thereof.

In some embodiments, the semiconductor dies 142, 143 and 144 are memory dies. The memory dies may include memory devices such as static random access memory (SRAM) devices, dynamic random access memory (DRAM) devices, other suitable devices, or a combination thereof. In some embodiments, the semiconductor die 141 is a control die that is electrically connected to the memory dies (e.g., the semiconductor dies 142, 143 and 144) stacked thereon. The chip structure 140 may function as a high bandwidth memory (HBM).

Many variations and/or modifications can be made to embodiments of the disclosure. In some embodiments, the chip structure 140 includes a single semiconductor chip. The semiconductor chip may be a system on chip.

In some embodiments, conductive bonding structures 146 are formed between the semiconductor dies 141, 142, 143 and 144 to bond them together, as shown in FIG. 1A. In some embodiments, each of the conductive bonding structures 146 includes metal pillars and/or solder bumps.

In some embodiments, underfill layers 147 are formed between the semiconductor dies 141, 142, 143 and 144 to surround and protect the conductive bonding structures 146. In some embodiments, the underfill layer 147 includes an epoxy-based resin with fillers dispersed therein. The fillers may include insulating fibers, insulating particles, other suitable elements, or a combination thereof.

In some embodiments, multiple conductive vias 148 are formed in the semiconductor dies 141, 142, and 143, as shown in FIG. 1A. Each conductive via 148 penetrates through one of the semiconductor dies 141, 142, and 143 and is electrically connected to the conductive bonding structures 146 thereunder and/or thereover. Electrical signals can be transmitted between these vertically stacked semiconductor dies 141, 142, 143 and 144 through the conductive vias 148.

As shown in FIG. 1A, an underfill layer 160 is formed into a gap G1 between the substrate 110 and each of the chip structures 120, 130, and 140, in accordance with some embodiments. As shown in FIG. 1A, a gap G2 between the chip structures 130 and 140 is filled with a portion 162 of the underfill layer 160, in accordance with some embodiments.

As shown in FIG. 1A, a gap G3 between the chip structures 120 and 130 is filled with the underfill layer 160, in accordance with some embodiments. The underfill layer 160 surrounds the chip structures 120, 130, and 140, in accordance with some embodiments. The underfill layer 160 is referred to as a protective layer, in accordance with some embodiments. The underfill layer 160 includes a polymer material, in accordance with some embodiments As shown in FIG. 1A, a molding layer 170 is formed over the substrate 110 to surround the chip structures 120, 130 and 140 and the conductive bumps 150, in accordance with some embodiments. The molding layer 170 includes a polymer material, in accordance with some embodiments.

Figure 1B:
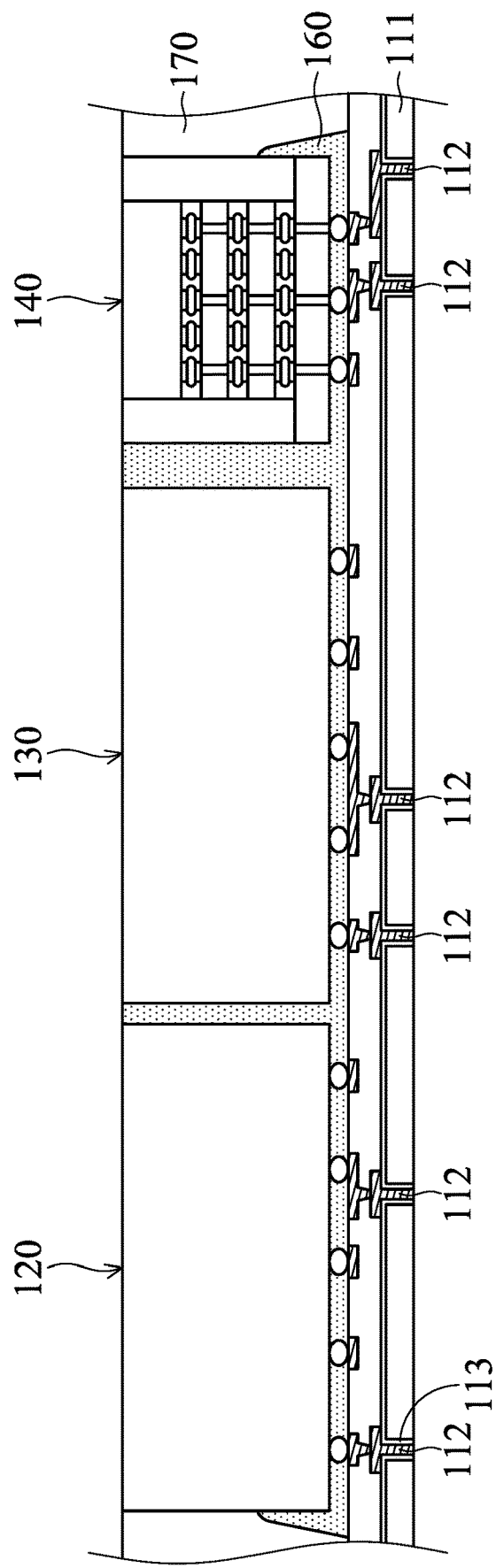

As shown in FIG. 1B, a lower portion of the semiconductor structure 111 is removed, in accordance with some embodiments. The removal process includes a chemical mechanical polishing process, in accordance with some embodiments. After the removal process, the conductive vias 112 and the insulating layer 113 are exposed, in accordance with some embodiments.

The conductive vias 112 and the insulating layer 113 pass through the semiconductor structure 111, in accordance with some embodiments. The conductive vias 112 are also referred to as through-substrate vias or through-silicon vias when the semiconductor structure 111 is a silicon substrate, in accordance with some embodiments.

Figure 1C:
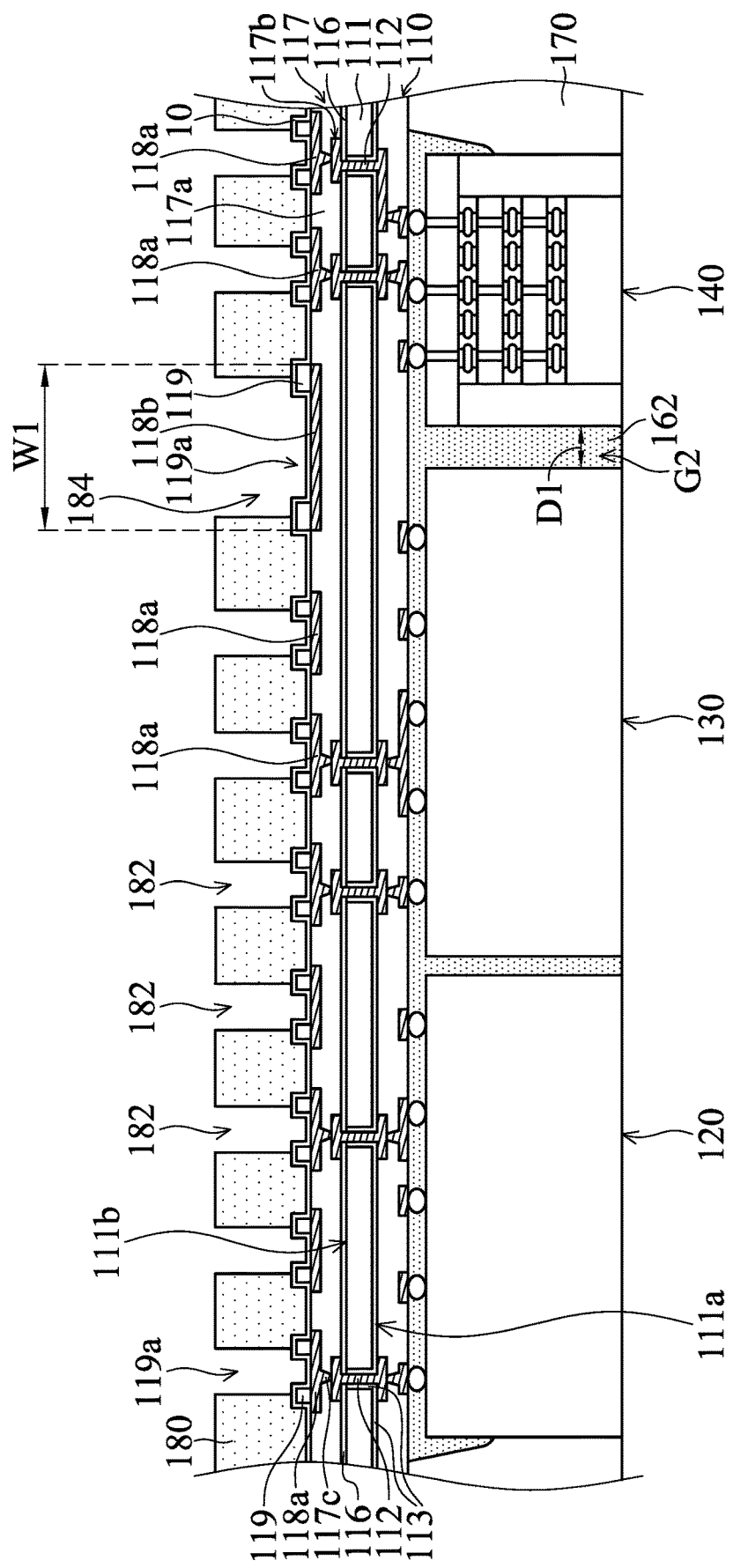

As shown in FIG. 1C, the semiconductor structure 111 is flipped upside down, in accordance with some embodiments. As shown in FIG. 1C, an insulating layer 116 is formed over the surface 111b, in accordance with some embodiments. The insulating layer 116 is configured to electrically insulate wiring layers subsequently formed thereon from the semiconductor structure 111, in accordance with some embodiments. The insulating layer 116 is made of an oxide-containing material such as silicon oxide, in accordance with some embodiments. The insulating layer 116 is formed using an oxidation process, a deposition process, or another suitable process.

In some embodiments, a redistribution structure 117 is formed over the surface 111b of the semiconductor structure 111, in accordance with some embodiments. The redistribution structure 117 includes a dielectric layer 117a, wiring layers 117b, and conductive vias 117c, in accordance with some embodiments. The wiring layers 117b are formed in the dielectric layer 117a, in accordance with some embodiments.

As shown in FIG. 1C, conductive pads 118a and 118b are formed over the redistribution structure 117, in accordance with some embodiments. The conductive pad 118b is wider than the conductive pads 118a, in accordance with some embodiments. The conductive pad 118b is right over the gap G2 and the portion 162 of the underfill layer 160 in the gap G2, in accordance with some embodiments. The conductive pad 118b extends across the gap G2 and the portion 162, in accordance with some embodiments. A width W1 of the conductive pad 118b is greater than a distance D1 between the chip structures 130 and 140, in accordance with some embodiments.

The conductive vias 117c are electrically connected between different wiring layers 117b and between the wiring layer 117b and the conductive pads 118a and 118b, in accordance with some embodiments. For the sake of simplicity, FIG. 1C only shows one of the wiring layers 117b, in accordance with some embodiments. The conductive vias 112 are electrically connected to the conductive pads 118a and 118b through the wiring layers 117b and the conductive vias 117c, in accordance with some embodiments.

As shown in FIG. 1C, buffer rings 119 are formed over the conductive pads 118a and 118b, in accordance with some embodiments. The buffer ring 119 has an opening 119a exposing the conductive pads 118a or 118b thereunder, in accordance with some embodiments. The buffer rings 119 are configured to buffer the stress between bumps subsequently formed thereover and the substrate 110, in accordance with some embodiments.

The buffer rings 119 are made of an elastic material such as a polymer material (e.g., polyimide), in accordance with some embodiments. In some other embodiments (not shown), the buffer rings 119 are replaced with a buffer layer having openings exposing the conductive pads 118a and 118b.

As shown in FIG. 1C, a seed layer 10 is formed over the redistribution structure 117, the buffer rings 119, and the conductive pads 118a and 118b, in accordance with some embodiments. The materials of the seed layer 10 may include copper or copper alloys. The materials of the seed layer 10 may include other metals, such as silver, gold, aluminum, and combinations thereof.

As shown in FIG. 1C, a mask layer 180 is formed over the seed layer 10, in accordance with some embodiments. The mask layer 180 has openings 182 exposing the seed layer 10 over the conductive pads 118a and the buffer rings 119 adjacent to the conductive pads 118a, in accordance with some embodiments. The mask layer 180 has openings 184 exposing the seed layer 10 over the conductive pads 118b and the buffer rings 119 adjacent to the conductive pads 118b, in accordance with some embodiments. The opening 184 is wider than the opening 182, in accordance with some embodiments. The mask layer 180 is made of a polymer material such as a photoresist material, in accordance with some embodiments.

Figure 1D:
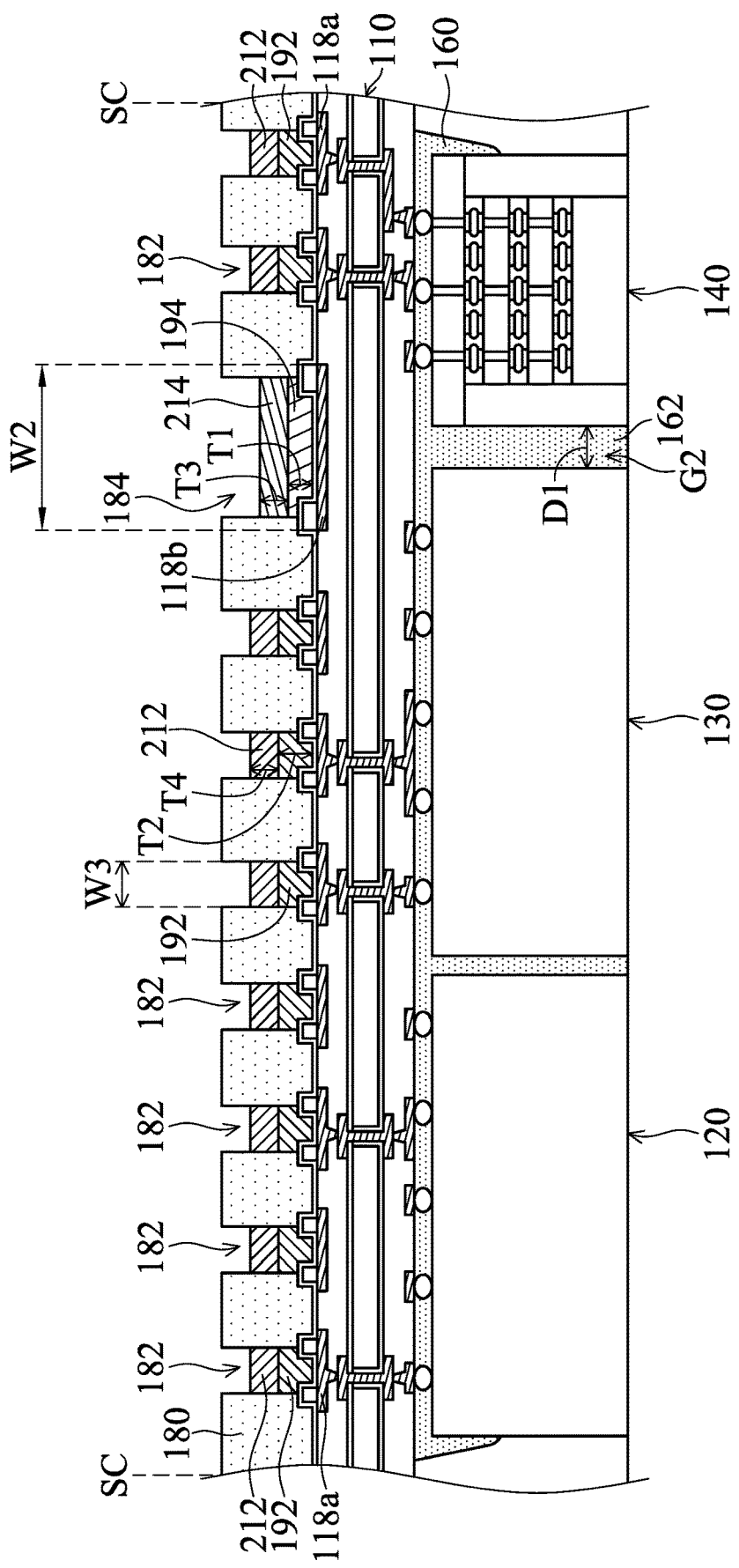

As shown in FIG. 1D, conductive bumps 192 are formed in the openings 182 and over the conductive pads 118a, in accordance with some embodiments. As shown in FIG. 1D, anti-warpage bumps 194 are formed in the openings 184 and over the conductive pads 118b, in accordance with some embodiments. Each anti-warpage bump 194 extends across the gap G2 between the chip structures 130 and 140, in accordance with some embodiments.

The anti-warpage bumps 194 extend across the portion 162 of the underfill layer 160 in the gap G2, in accordance with some embodiments. The anti-warpage bumps 194 are configured to reduce the warpage of the substrate 110, in accordance with some embodiments.

As shown in FIG. 1D, a width W2 of the anti-warpage bump 194 is greater than the distance D1 between the chip structures 130 and 140, in accordance with some embodiments. The width W2 of the anti-warpage bump 194 is greater than a width W3 of the conductive bump 192, in accordance with some embodiments. In some embodiments, the anti-warpage bumps 194 are electrically connected to the chip structures 120, 130, and/or 140 through the substrate 110. In some other embodiments, the anti-warpage bumps 194 are electrically insulated from the chip structures 120, 130, and/or 140.

In some embodiments, the anti-warpage bump 194 is thinner than the conductive bump 192, in accordance with some embodiments. The maximum thickness T1 of the anti-warpage bump 194 is less than the maximum thickness T2 of the conductive bump 192, in accordance with some embodiments. In some embodiments, the maximum thickness T1 of the anti-warpage bump 194 is equal to the maximum thickness T2 of the conductive bump 192.

In some embodiments, a ratio of the maximum thickness T1 to the maximum thickness T2 ranges from about 0.8 to about 1. The conductive bump 192 and the anti-warpage bumps 194 are made of a conductive material such as copper (Cu), aluminum (Al), tungsten (W), cobalt (Co), or nickel (Ni), in accordance with some embodiments. The conductive bumps 192 and the anti-warpage bumps 194 are formed using a plating process such as an electroplating process, in accordance with some embodiments.

As shown in FIG. 1D, a solder layer 212 is formed over the conductive bumps 192, in accordance with some embodiments. As shown in FIG. 1D, a solder layer 214 is formed over the anti-warpage bumps 194, in accordance with some embodiments. The solder layer 214 is thinner than the solder layer 212, in accordance with some embodiments. That is, a thickness T3 of the solder layer 214 is less than a thickness T4 of the solder layer 212, in accordance with some embodiments. In some other embodiments, the thickness T3 is equal to the thickness T4.

In some embodiments, a ratio of the thickness T3 to the thickness T4 ranges from about 0.8 to about 1. The solder layers 212 and 214 are made of tin (Sn) or another suitable conductive material with a melting point lower than that of the anti-warpage bumps 194, in accordance with some embodiments. The solder layers 212 and 214 are formed using a plating process such as an electroplating process, in accordance with some embodiments.

Figure 1E:
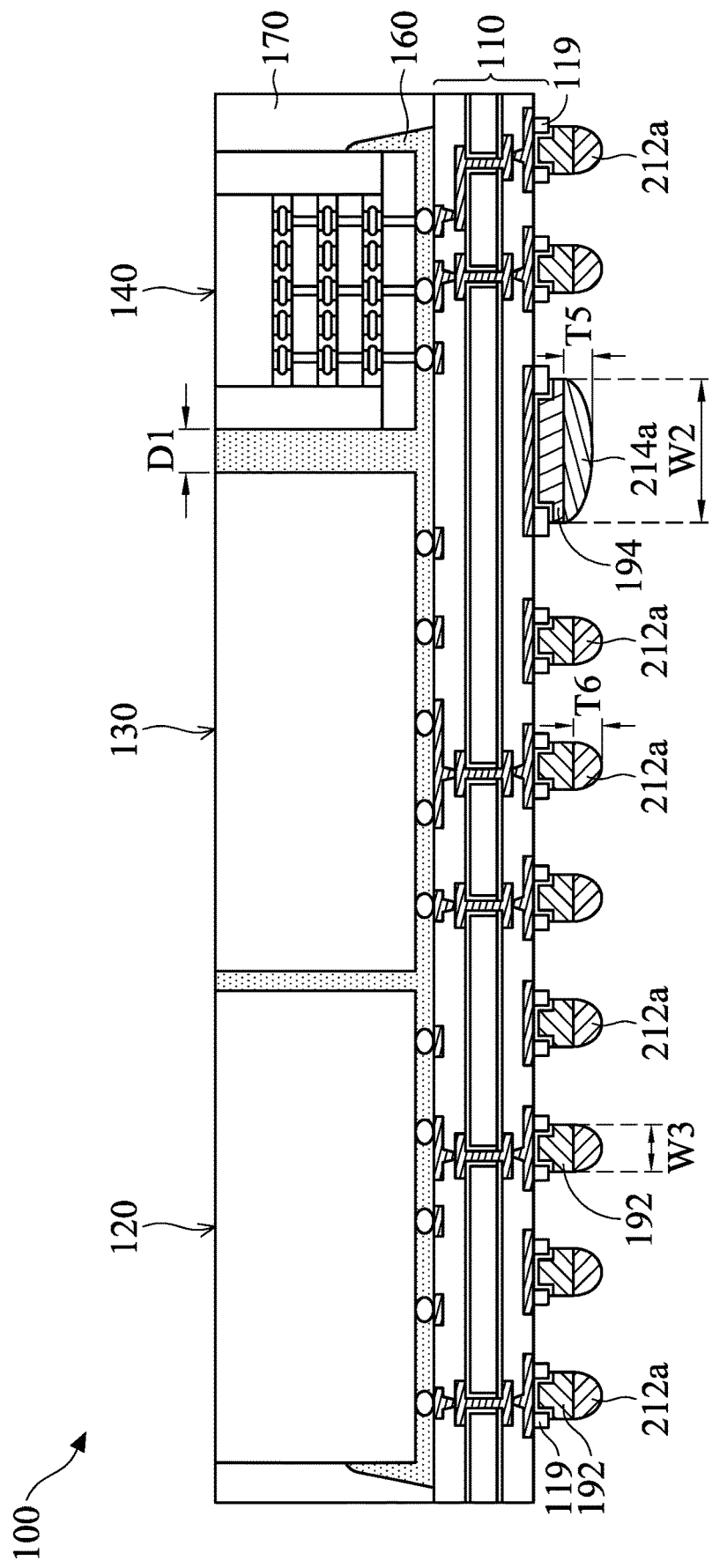

As shown in FIG. 1E, the mask layer 180 is removed, in accordance with some embodiments. As shown in FIG. 1E, the seed layer 10 originally covered by the mask layer 180 is removed, in accordance with some embodiments. The seed layer 10 is removed using an etching process, in accordance with some embodiments. As shown in FIG. 1E, a reflow process is performed over the solder layers 212 and 214 to convert the solder layers 212 and 214 into solder balls 212a and 214a, in accordance with some embodiments.

In some embodiments, a maximum thickness T5 of the solder ball 214a is less than a maximum thickness T6 of the solder ball 212a. In some other embodiments, the thickness T5 is equal to the thickness T6. In some embodiments, a ratio of the thickness T5 to the thickness T6 ranges from about 0.8 to about 1.

In some embodiments, a combination structure of the chip structures 120, 130 and 140, the underfill layer 160, and the molding layer 170 has a first coefficient of thermal expansion. In some embodiments, the substrate 110 has a second coefficient of thermal expansion. In some embodiments, the anti-warpage bumps 194 have a third coefficient of thermal expansion.

The first coefficient of thermal expansion is greater than the second coefficient of thermal expansion, in accordance with some embodiments. The third coefficient of thermal expansion is greater than the second coefficient of thermal expansion, in accordance with some embodiments. Therefore, the anti-warpage bumps 194 with greater coefficient of thermal expansion (than that of the substrate 110) may reduce the warpage of the substrate 110 caused by the combination structure with greater coefficient of thermal expansion (than that of the substrate 110).

The first coefficient of thermal expansion ranges from about 100 ppm/° C. to about 140 ppm/° C., in accordance with some embodiments. The Young's Modulus of the combination structure ranges from about 4 Gpa to about 8 Gpa, in accordance with some embodiments. The second coefficient of thermal expansion ranges from about 1 ppm/° C. to about 4 ppm/° C., in accordance with some embodiments. The Young's Modulus of the substrate 110 ranges from about 170 Gpa to about 210 Gpa, in accordance with some embodiments. The third coefficient of thermal expansion ranges from about 14 ppm/° C. to about 21 ppm/° C., in accordance with some embodiments. The Young's Modulus of the anti-warpage bumps 194 ranges from about 110 Gpa to about 150 Gpa, in accordance with some embodiments.

The distance D1 between the chip structures 130 and 140 ranges from about 20 m to about 200 μm, in accordance with some embodiments. The distance D1 ranges from about 30 μm to about 120 μm, in accordance with some embodiments. In some embodiments, a ratio of the width W2 of the anti-warpage bumps 194 to the distance D1 ranges from about 3 to about 50. In some embodiments, a ratio of the width W2 of the anti-warpage bumps 194 to the width W3 of the conductive bump 192 ranges from about 2 to about 10.

The melting point (or the melting temperature) of the anti-warpage bumps 194 is higher than that of the solder layer 214 (as shown in FIG. 1D), in accordance with some embodiments. Therefore, the anti-warpage bump 194 may maintain its shape after the reflow process is performed over the solder layer 214.

In some embodiments, the anti-warpage bumps 194 are electrically connected to the chip structures 120, 130 and 140, the substrate 110, the conductive bumps 192, and/or the solder balls 212a. In some other embodiments, the anti-warpage bumps 194 are not electrically connected to the chip structures 120, 130 and 140, the substrate 110, the conductive bumps 192, and/or the solder balls 212a.

As shown in FIGS. 1D and 1E, a cutting process is performed to cut through the substrate 110 and the molding layer 170 along predetermined scribe lines SC to form chip packages 100, in accordance with some embodiments. For the sake of simplicity, FIG. 1E only shows one of the chip packages 100, in accordance with some embodiments. As shown in FIG. 1E, the chip package 100 is flipped upside down, in accordance with some embodiments.

Figure 2:
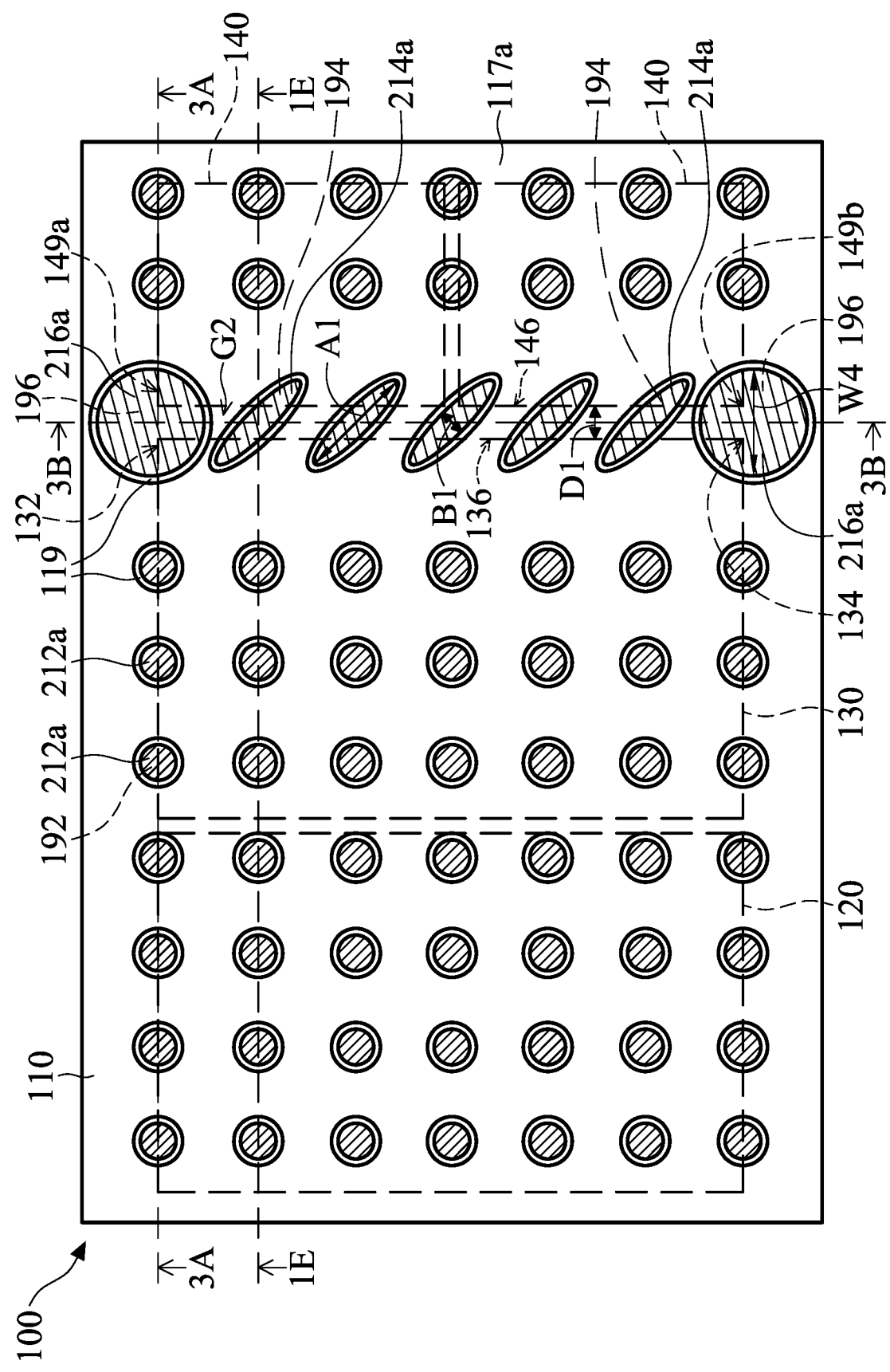
FIG. 2 is a bottom view of the chip package structure in FIG. 1E, in accordance with some embodiments.

FIG. 2 is a bottom view of the chip package structure 100 in FIG. 1E, in accordance with some embodiments. FIG. 1E is a cross-sectional view illustrating the chip package structure 100 along a sectional line 1E-1E in FIG. 2, in accordance with some embodiments.

As shown in FIGS. 1E and 2, the solder balls 214a and the anti-warpage bumps 194 have an oblique oval shape, in accordance with some embodiments. The solder balls 214a (or the anti-warpage bumps 194) with the oblique oval shape has a long axis length A1 and a short axis length B1, in accordance with some embodiments. In some embodiments, a ratio of the long axis length A1 to the short axis length B1 ranges from about 1.5 to about 5. In some embodiments, a ratio of the long axis length A1 to the distance D1 ranges from about 3 to about 10.

Figure 3A:
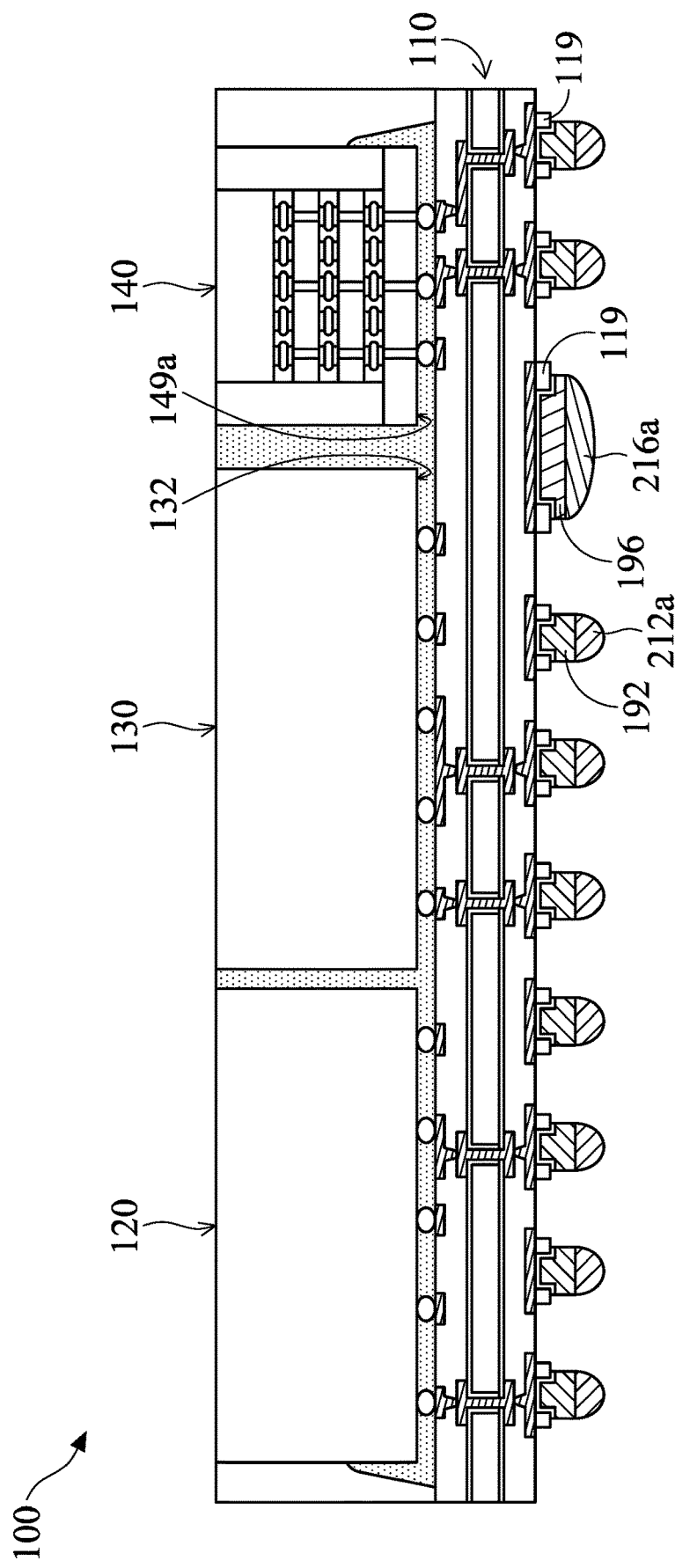
FIG. 3A is a cross-sectional view illustrating the chip package structure along a sectional line 3A-3A in FIG. 2, in accordance with some embodiments.

FIG. 3A is a cross-sectional view illustrating the chip package structure 100 along a sectional line 3A-3A in FIG. 2, in accordance with some embodiments. As shown in FIGS. 2 and 3A, the chip package structure 100 further includes anti-warpage bumps 196 and solder balls 216a, in accordance with some embodiments. The anti-warpage bumps 196 and the solder balls 216a are under corners 132, 134, 149a, and 149b of the chip structures 130 and 140, in accordance with some embodiments. The anti-warpage bumps 196 (or the solder balls 216a) extend across the gap G2 between the chip structures 130 and 140, in accordance with some embodiments.

The anti-warpage bumps 194 and 196 are arranged in a straight line, in accordance with some embodiments. The straight line is parallel to edges 136 and 146 of the chip structures 130 and 140, in accordance with some embodiments. The anti-warpage bumps 196 have a round shape, in accordance with some embodiments.

Since the layout density of the conductive bumps 192 in the periphery region of the substrate 110 is less than the layout density of the conductive bumps 192 in the central region of the substrate 110, the periphery region provides more space than the central region. Therefore, the anti-warpage bump 196 formed in the periphery region is larger than the anti-warpage bump 194 formed in the central region, in accordance with some embodiments.

The anti-warpage bump 196 is wider than the anti-warpage bump 194, in accordance with some embodiments. That is, the width W4 of the anti-warpage bump 196 (or the solder ball 216a) is greater than the long axis length A1, in accordance with some embodiments. In some embodiments, a ratio of the width W4 to the long axis length A1 ranges from about 1.1 to about 10. In some embodiments, the ratio of the width W4 to the long axis length A1 ranges from about 4 to about 10. In some embodiments, the width W4 is greater than the long axis length A1. In some embodiments, a ratio of the width W4 to the short axis length B1 ranges from about 10 to about 18. The width W4 ranges from about 1800 µm to about 2600 µm, in accordance with some embodiments. The anti-warpage bump 196 is wider than the conductive bump 192, in accordance with some embodiments.

Figure 3B:
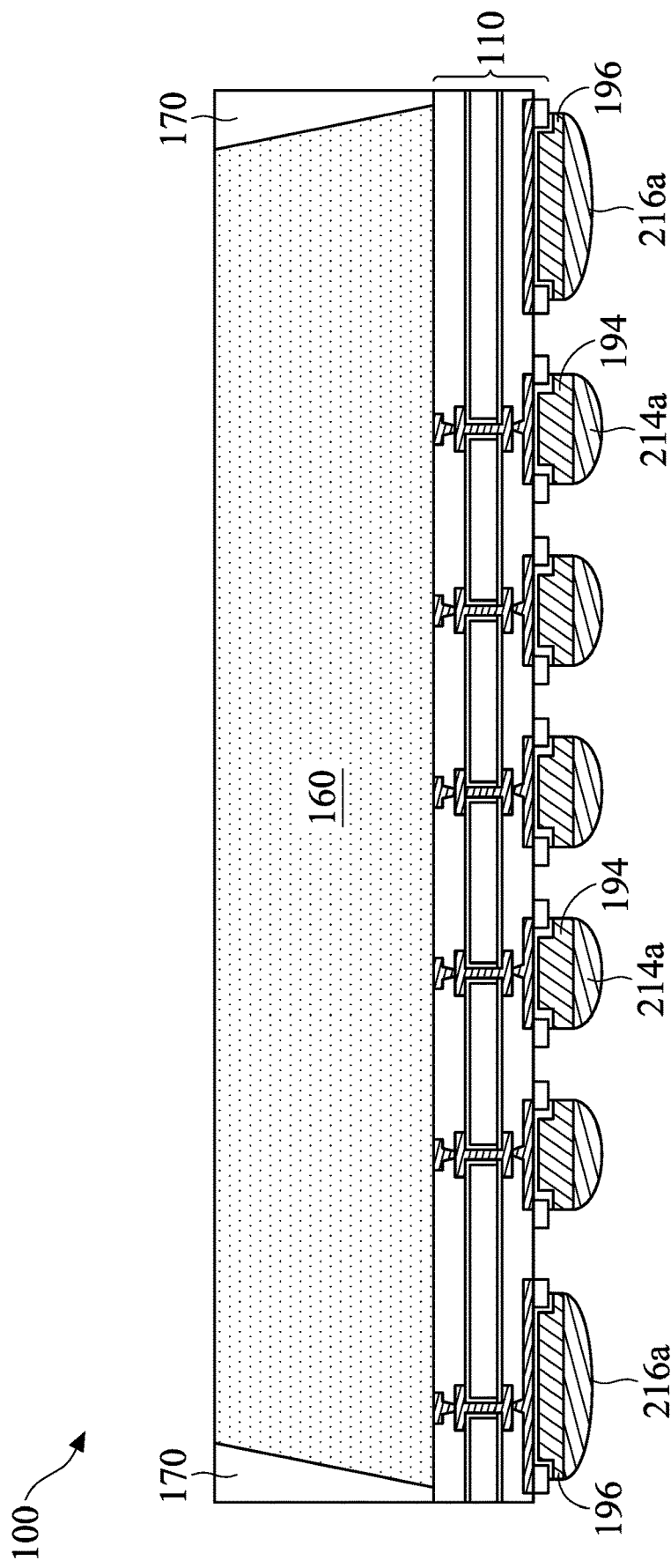
FIG. 3B is a cross-sectional view illustrating the chip package structure along a sectional line 3B-3B in FIG. 2, in accordance with some embodiments.

FIG. 3B is a cross-sectional view illustrating the chip package structure 100 along a sectional line 3B-3B in FIG. 2, in accordance with some embodiments. As shown in FIGS. 2 and 3B, the anti-warpage bump 196 is thinner than the anti-warpage bump 194, in accordance with some embodiments. The solder ball 216a is thinner than the solder ball 214a, in accordance with some embodiments.

As shown in FIG. 2, the chip structure 120 or 130 is wider than the chip structure 140, in accordance with some embodiments. The chip structures 120 and 130 have the same size (width and/or length), in accordance with some embodiments.

Figure 4:
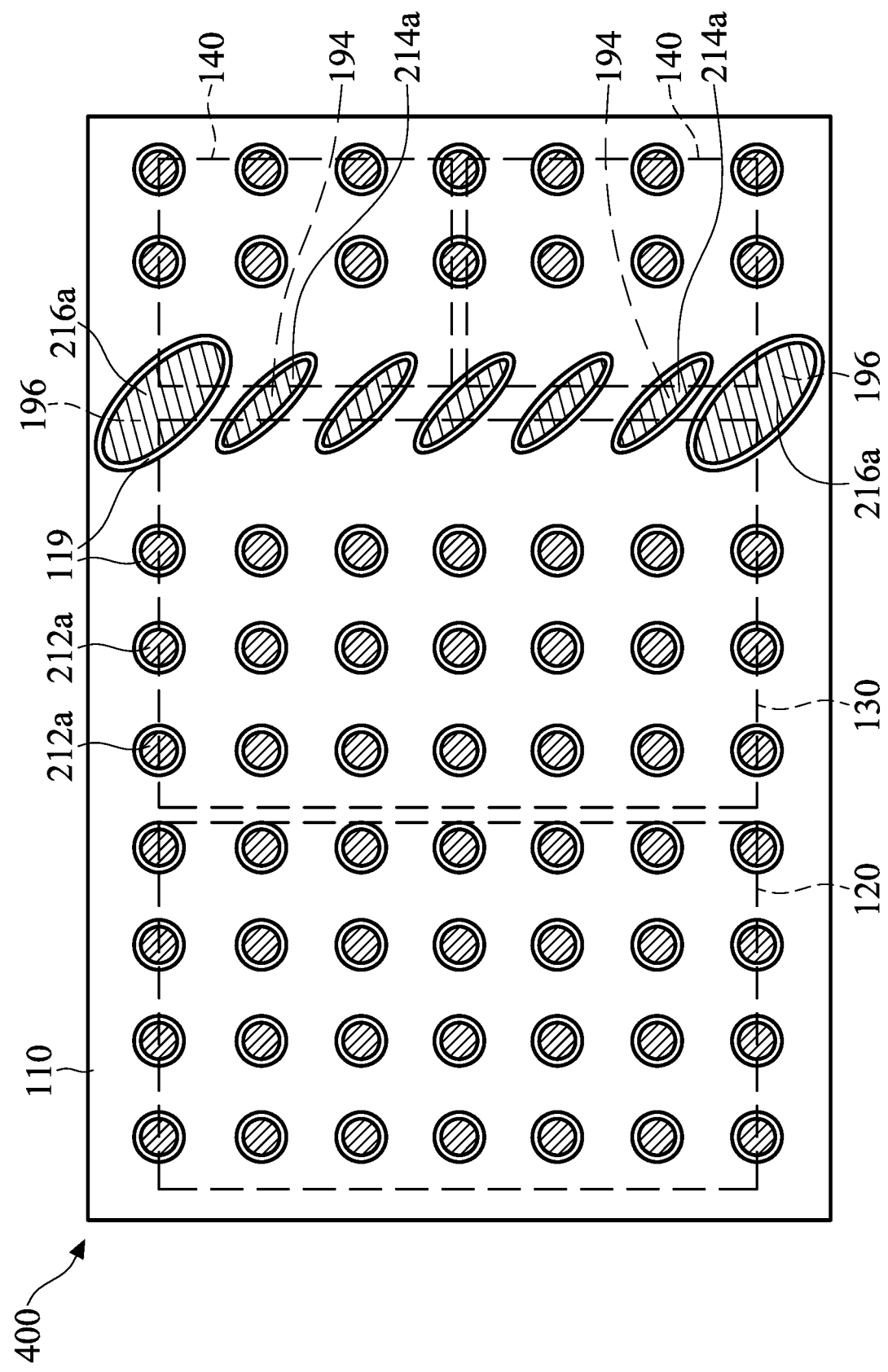
FIG. 4 is a bottom view of a chip package structure, in accordance with some embodiments.

FIG. 4 is a bottom view of a chip package structure 400, in accordance with some embodiments. As shown in FIG. 4, the chip package structure 400 is similar to the chip package structure 100 of FIG. 2, except that the anti-warpage bumps 196 and the solder balls 216a of the chip package structure 400 have an oblique oval shape, in accordance with some embodiments.

Figure 5:
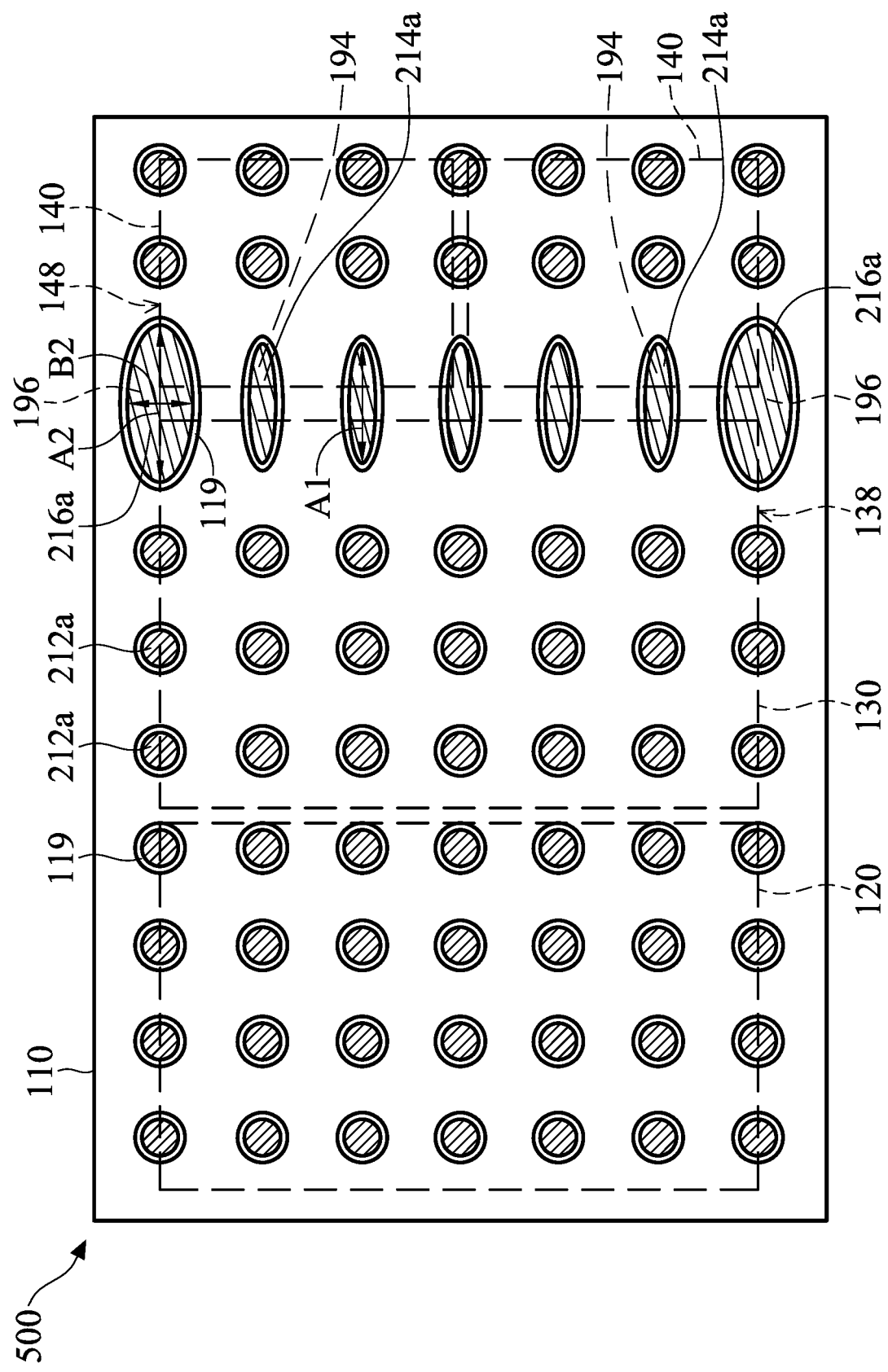
FIG. 5 is a bottom view of a chip package structure, in accordance with some embodiments.

FIG. 5 is a bottom view of a chip package structure 500, in accordance with some embodiments. As shown in FIG. 5, the chip package structure 500 is similar to the chip package structure 400 of FIG. 4, except that the anti-warpage bumps 194 and 196 and the solder balls 214a and 216a of the chip package structure 500 have a horizontal oval shape, in accordance with some embodiments.

The anti-warpage bump 196 has a long axis length A2 and a short axis length B2, in accordance with some embodiments. The long axis length A2 ranges from about 1800 µm to about 2600 µm, in accordance with some embodiments. The short axis length B2 ranges from about 550 µm to about 950 µm, in accordance with some embodiments.

The long axes of the anti-warpage bumps 194 and 196 are parallel to each other, in accordance with some embodiments. The long axes of the anti-warpage bumps 194 and 196 are parallel to edges 138 and 148 of the chip structures 130 and 140, in accordance with some embodiments.

Figure 6:
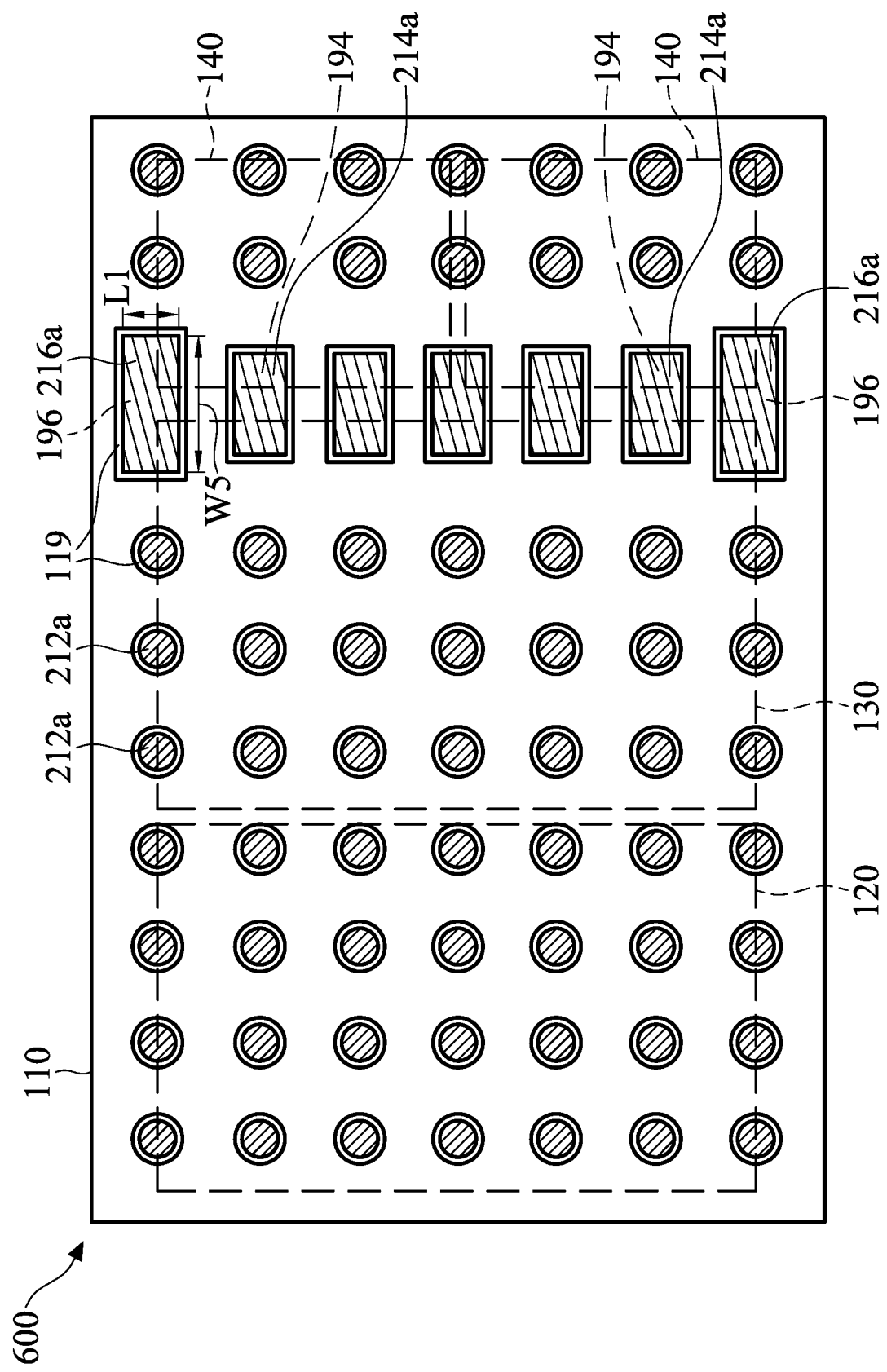
FIG. 6 is a bottom view of a chip package structure, in accordance with some embodiments.

FIG. 6 is a bottom view of a chip package structure 600, in accordance with some embodiments. As shown in FIG. 6, the chip package structure 600 is similar to the chip package structure 500 of FIG. 5, except that the anti-warpage bumps 194 and 196 and the solder balls 214a and 216a of the chip package structure 600 have a horizontal rectangular shape, in accordance with some embodiments.

The anti-warpage bump 196 has a width W5 and a length L1, in accordance with some embodiments. The width W5 ranges from about 1800 µm to about 2600 µm, in accordance with some embodiments. The length L1 ranges from about 550 µm to about 950 µm, in accordance with some embodiments.

Figure 7:
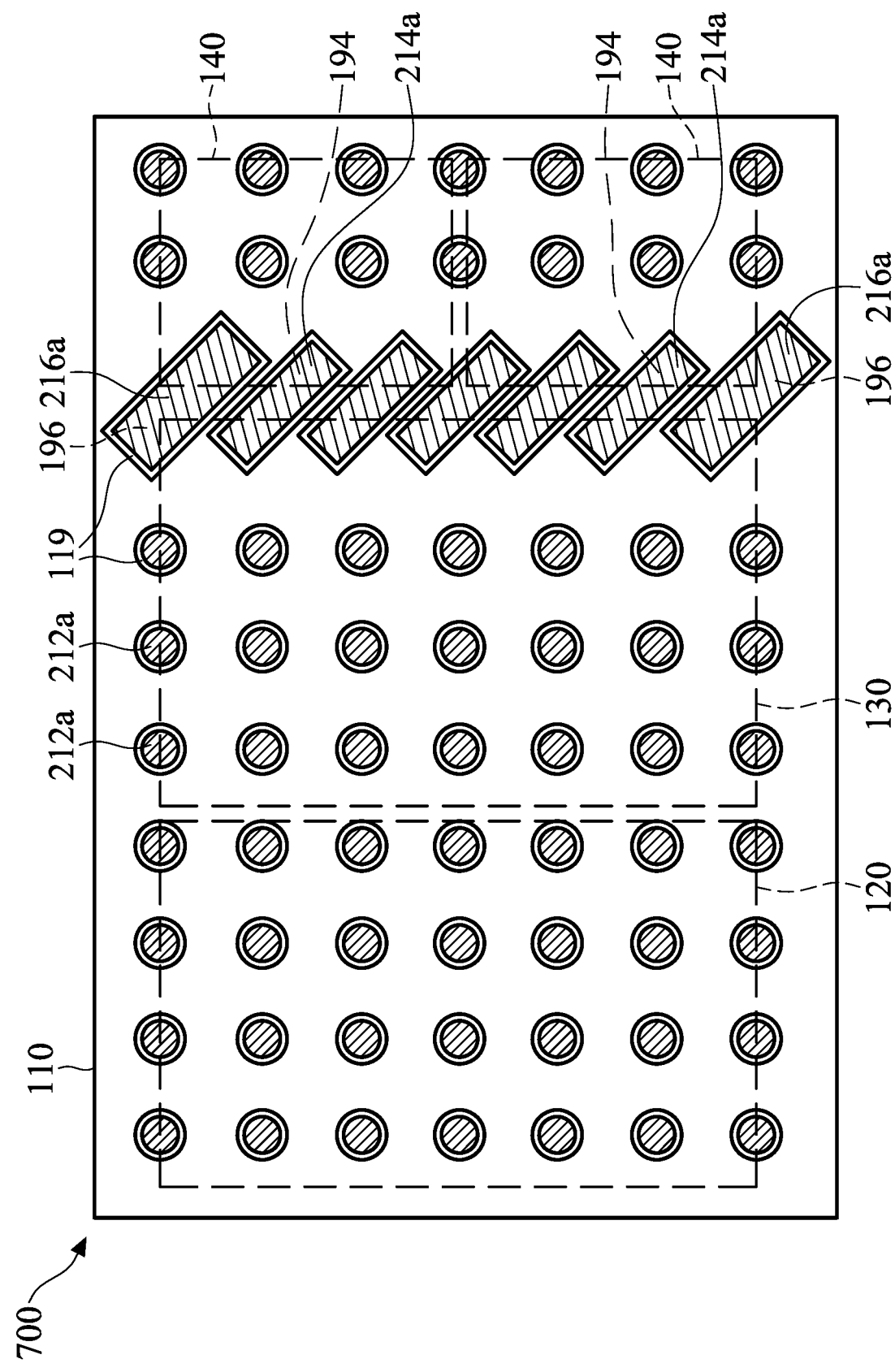
FIG. 7 is a bottom view of a chip package structure, in accordance with some embodiments.

FIG. 7 is a bottom view of a chip package structure 700, in accordance with some embodiments. As shown in FIG. 7, the chip package structure 700 is similar to the chip package structure 600 of FIG. 6, except that the anti-warpage bumps 194 and 196 and the solder balls 214a and 216a of the chip package structure 700 have an oblique rectangular shape, in accordance with some embodiments.

Figure 8:
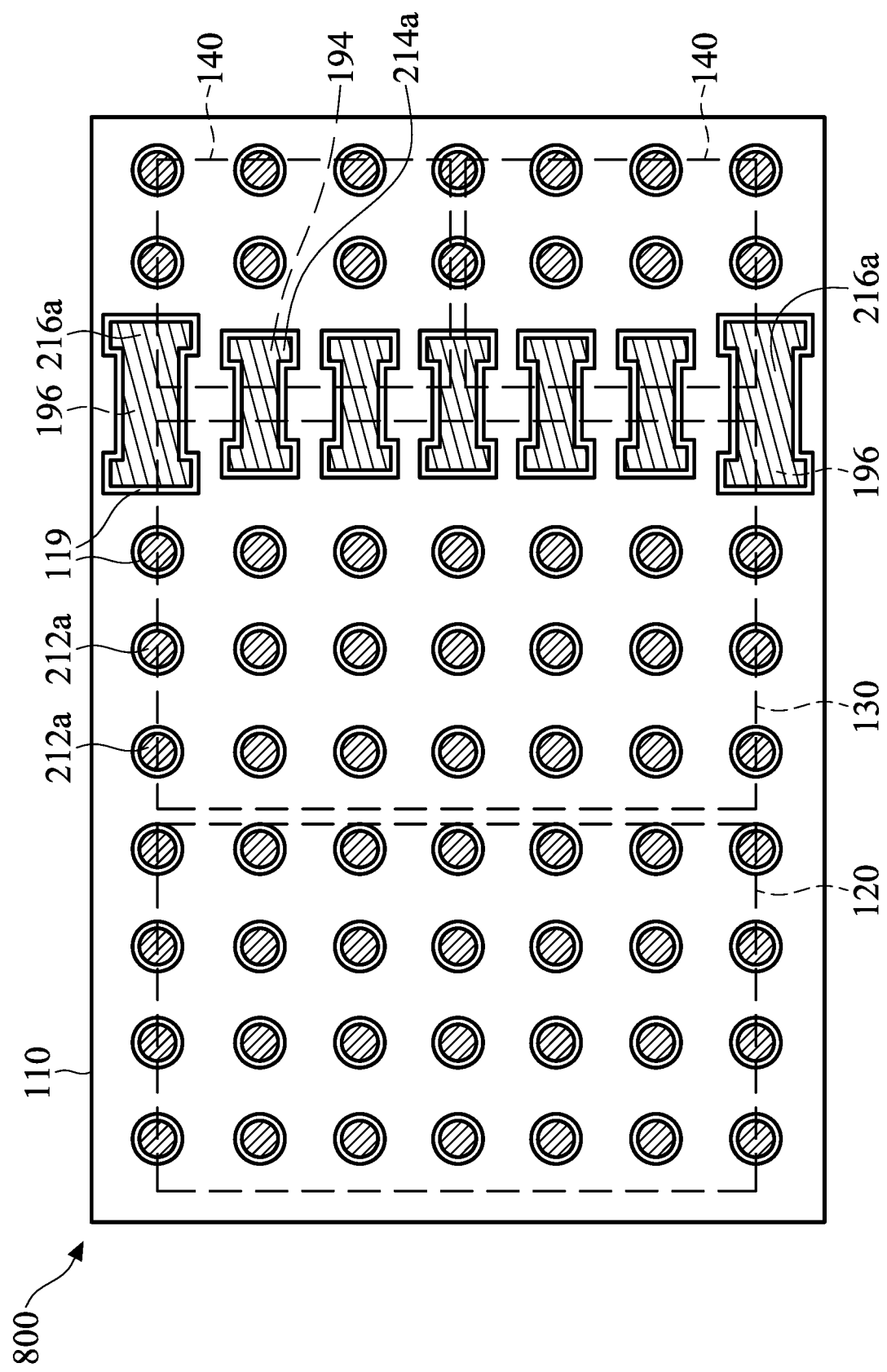
FIG. 8 is a bottom view of a chip package structure, in accordance with some embodiments.

FIG. 8 is a bottom view of a chip package structure 800, in accordance with some embodiments. As shown in FIG. 8, the chip package structure 800 is similar to the chip package structure 600 of FIG. 6, except that the anti-warpage bumps 194 and 196 and the solder balls 214a and 216a of the chip package structure 800 have an H-shape, in accordance with some embodiments.

Figure 9:
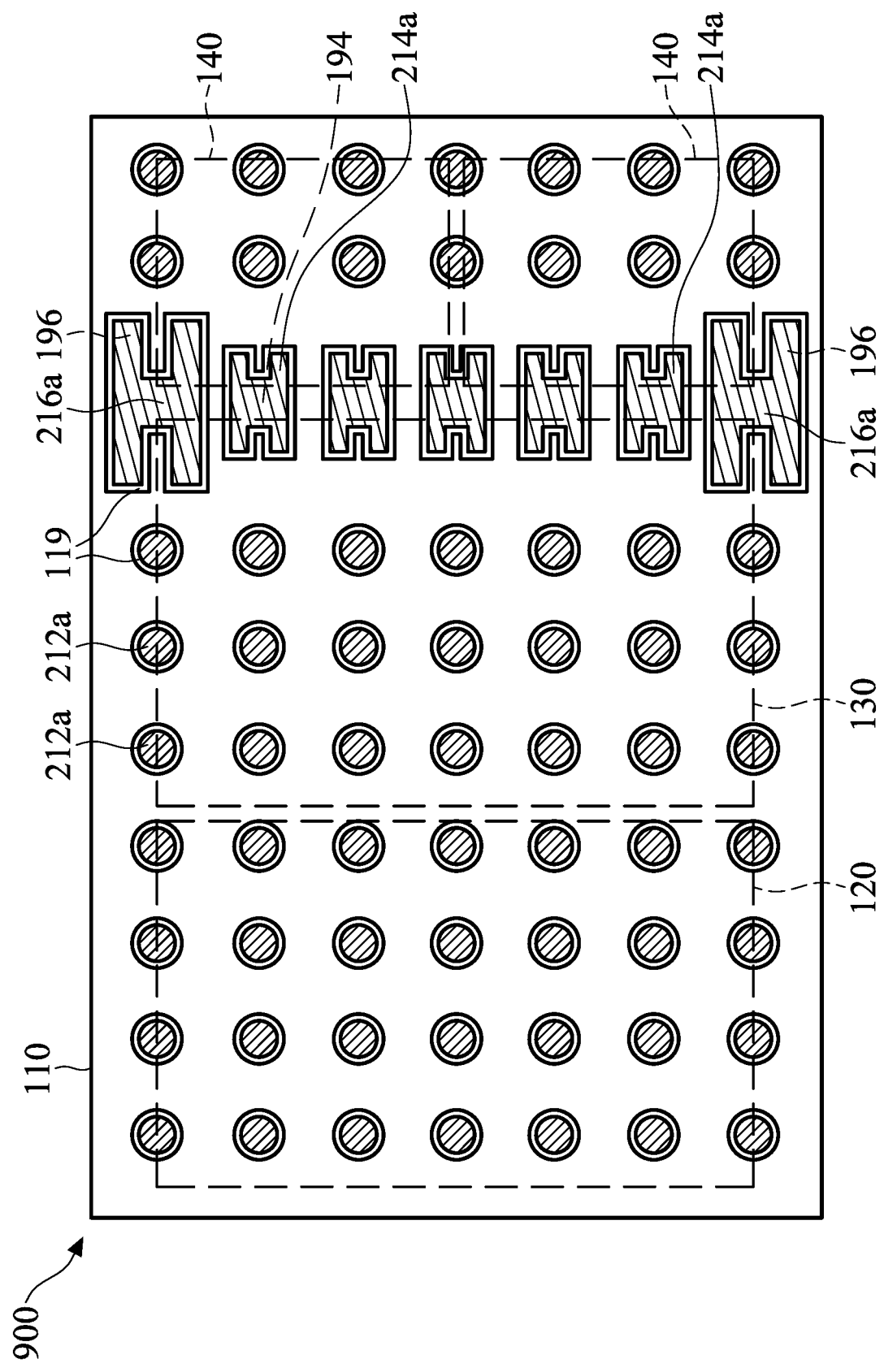
FIG. 9 is a bottom view of a chip package structure, in accordance with some embodiments.

FIG. 9 is a bottom view of a chip package structure 900, in accordance with some embodiments. As shown in FIG. 9, the chip package structure 900 is similar to the chip package structure 600 of FIG. 6, except that the anti-warpage bumps 194 and 196 and the solder balls 214a and 216a of the chip package structure 900 have a I-shape, in accordance with some embodiments.

Figure 10:
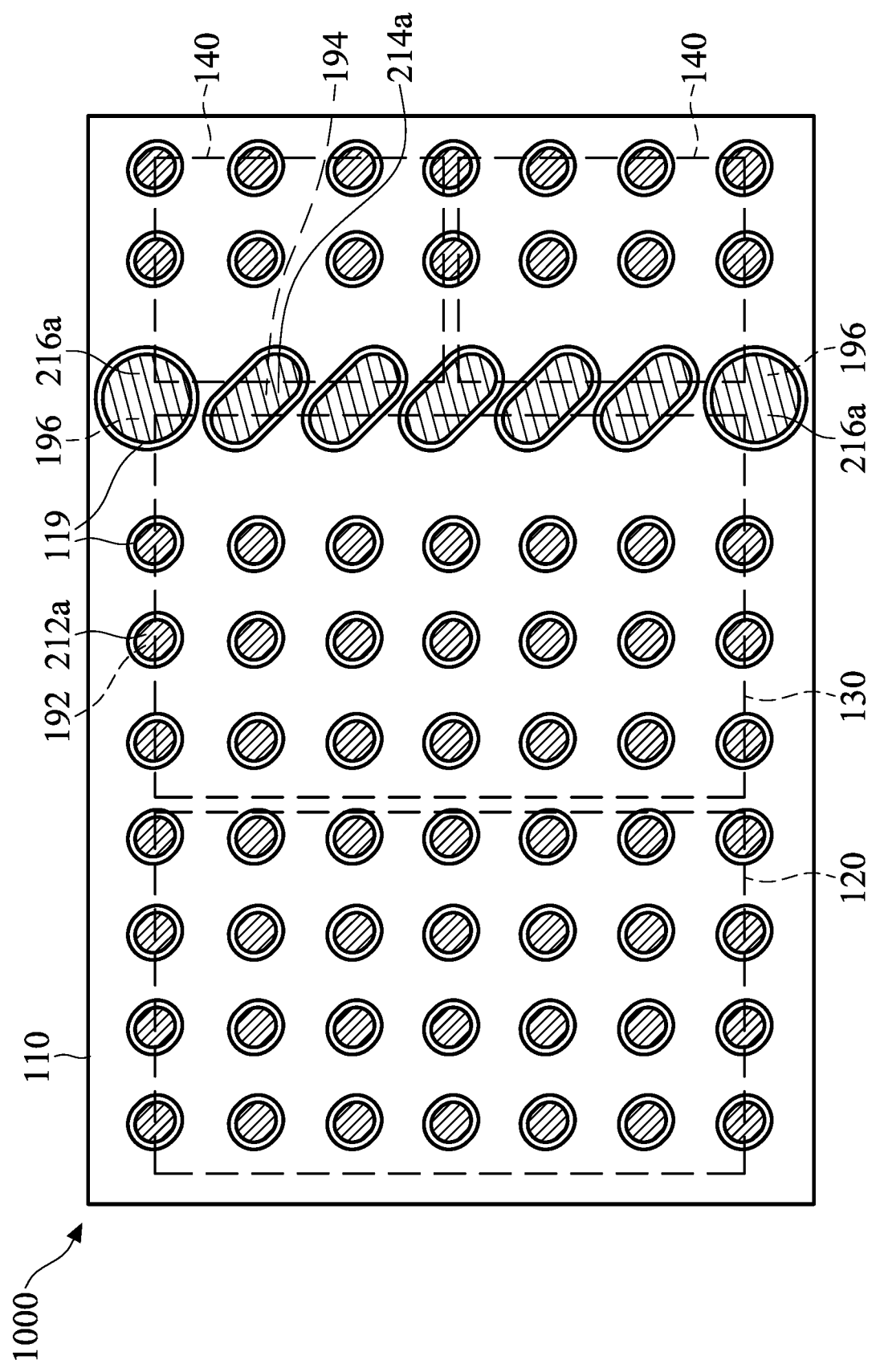
FIG. 10 is a bottom view of a chip package structure, in accordance with some embodiments.

FIG. 10 is a bottom view of a chip package structure 1000, in accordance with some embodiments. As shown in FIG. 10, the chip package structure 1000 is similar to the chip package structure 100 of FIG. 2, except that the anti-warpage bumps 194, the solder balls 212a and 214a, the conductive bumps 192 of the chip package structure 1000 have an oblique stripe shape, in accordance with some embodiments.

Figure 11:
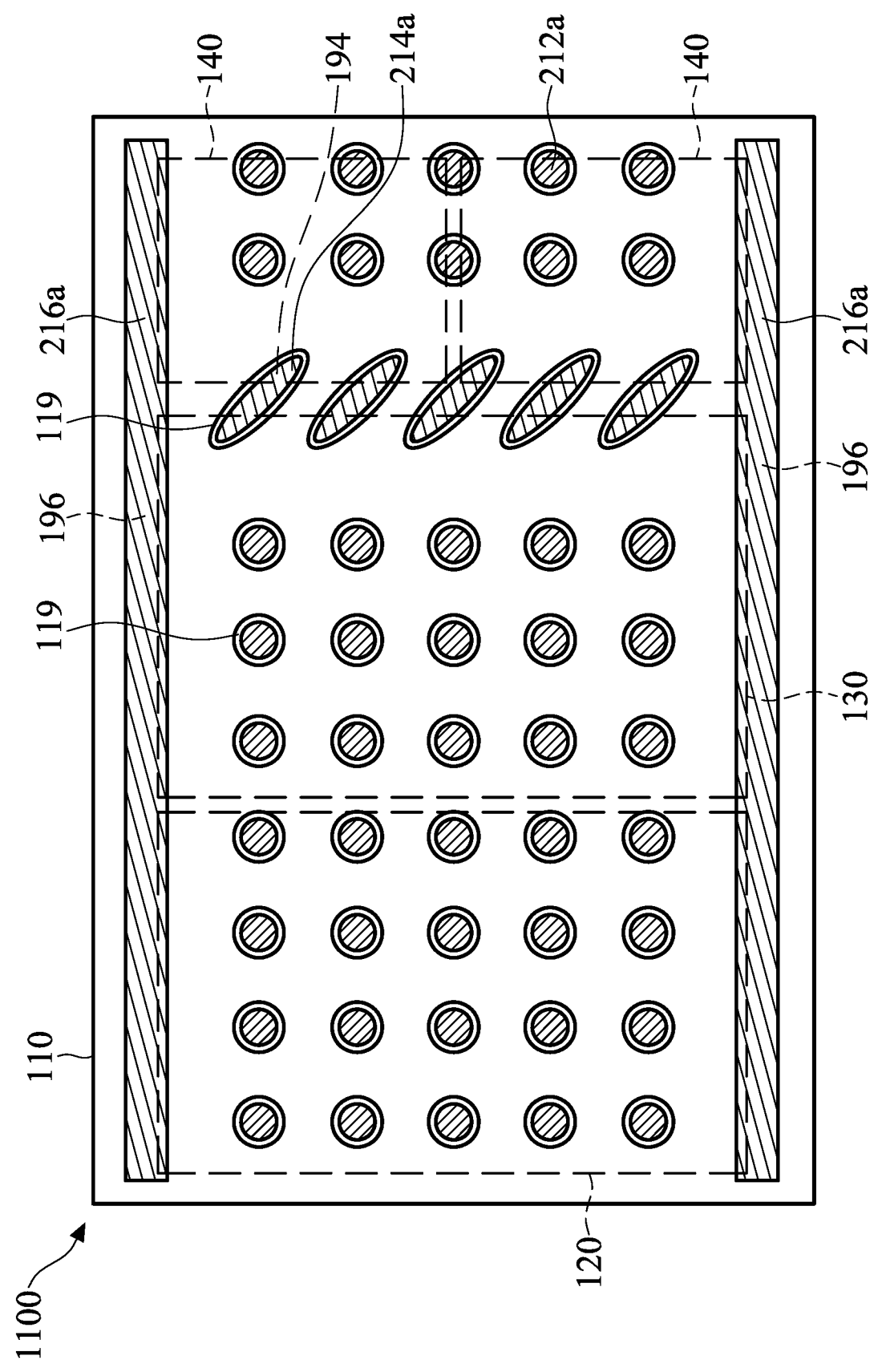
FIG. 11 is a bottom view of a chip package structure, in accordance with some embodiments.

FIG. 11 is a bottom view of a chip package structure 1100, in accordance with some embodiments. As shown in FIG. 11, the chip package structure 1100 is similar to the chip package structure 100 of FIG. 2, except that the anti-warpage bumps 196 and the solder balls 216a of the chip package structure 1100 have a bar shape or a strip shape, in accordance with some embodiments. The anti-warpage bumps 196 and the solder balls 216a extend across the chip structures 120, 130, and 140, in accordance with some embodiments.

Figure 12:
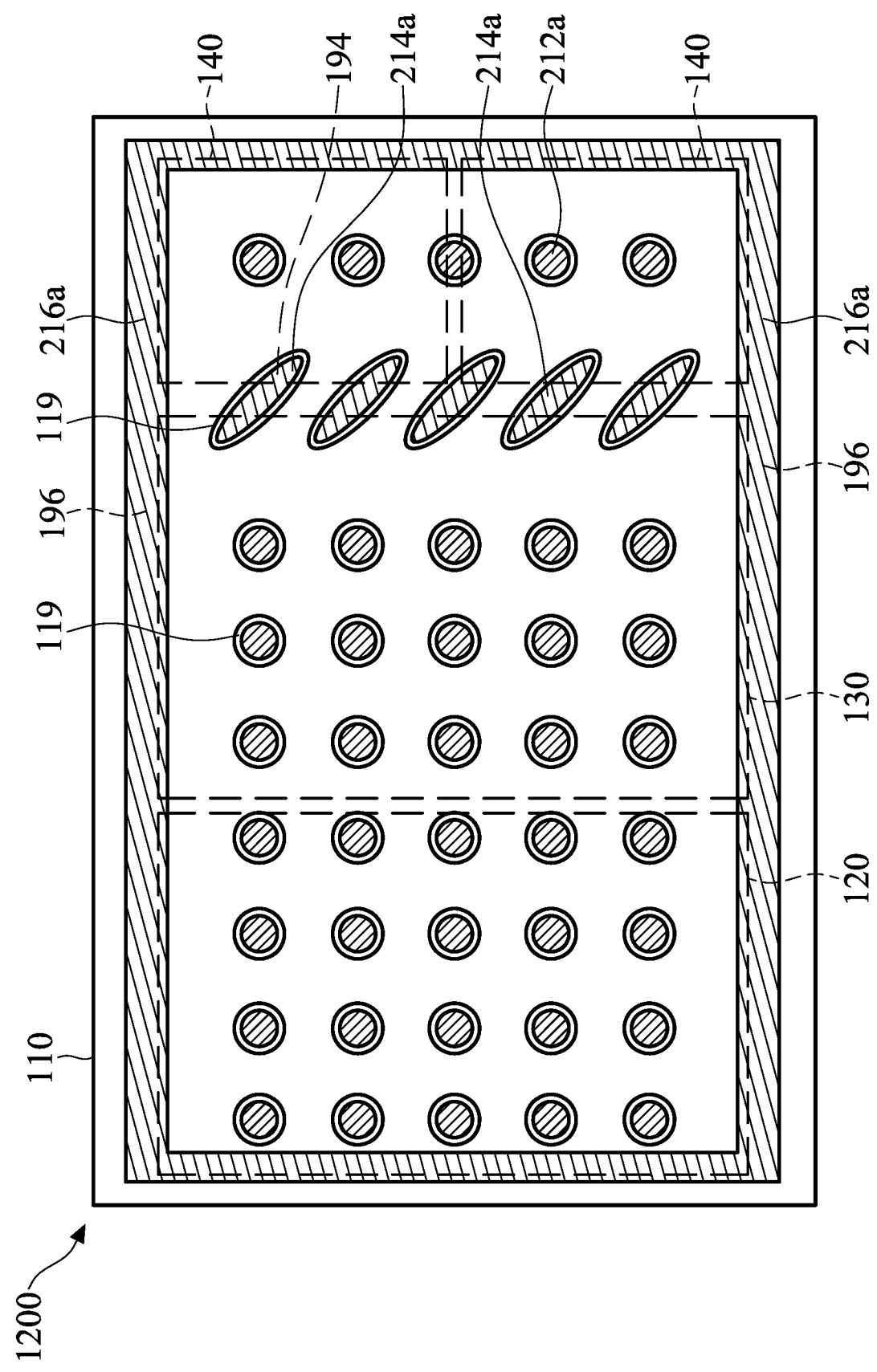
FIG. 12 is a bottom view of a chip package structure, in accordance with some embodiments.

FIG. 12 is a bottom view of a chip package structure 1200, in accordance with some embodiments. As shown in FIG. 12, the chip package structure 1200 is similar to the chip package structure 100 of FIG. 2, except that the anti-warpage bump 196 and the solder ball 216a of the chip package structure 1200 have a ring shape, in accordance with some embodiments. The anti-warpage bump 196 and the solder ball 216a surround the chip structures 120, 130, and 140, in accordance with some embodiments.

Figure 13:
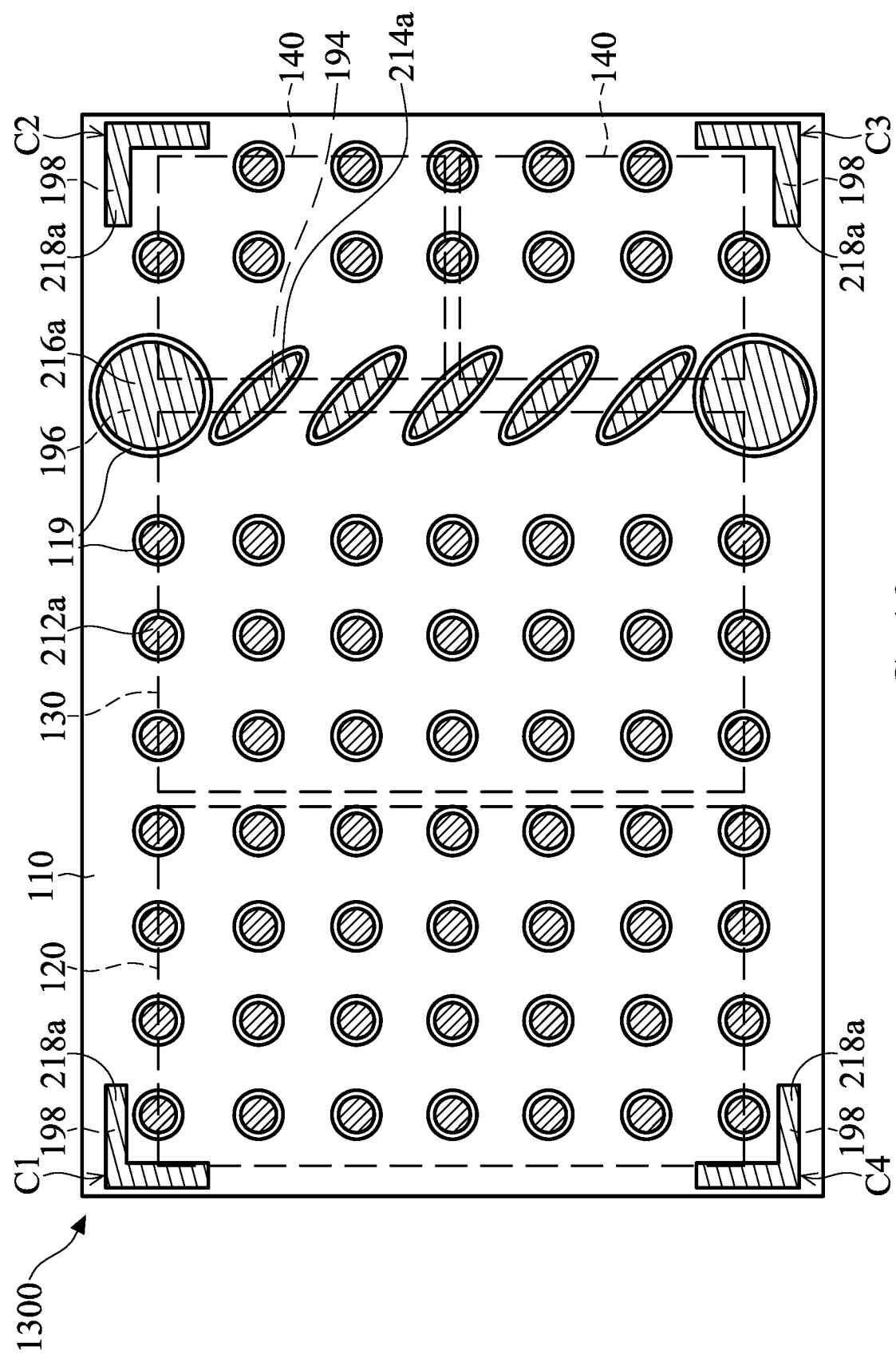
FIG. 13 is a bottom view of a chip package structure, in accordance with some embodiments.

FIG. 13 is a bottom view of a chip package structure 1300, in accordance with some embodiments. As shown in FIG. 13, the chip package structure 1300 is similar to the chip package structure 100 of FIG. 2, except that the chip package structure 1300 further includes protection bumps 198 and solder balls 218a over corners C1, C2, C3, and C4 of the substrate 110, in accordance with some embodiments.

The protection bumps 198 and the solder balls 218a have an L-shape, in accordance with some embodiments. Since the stress may concentrate at the corners C1, C2, C3, and C4 during the cutting process of FIGS. 1D and 1E, the formation of the protection bumps 198 and the solder balls 218a may strengthen the substrate 110.

Figure 14:
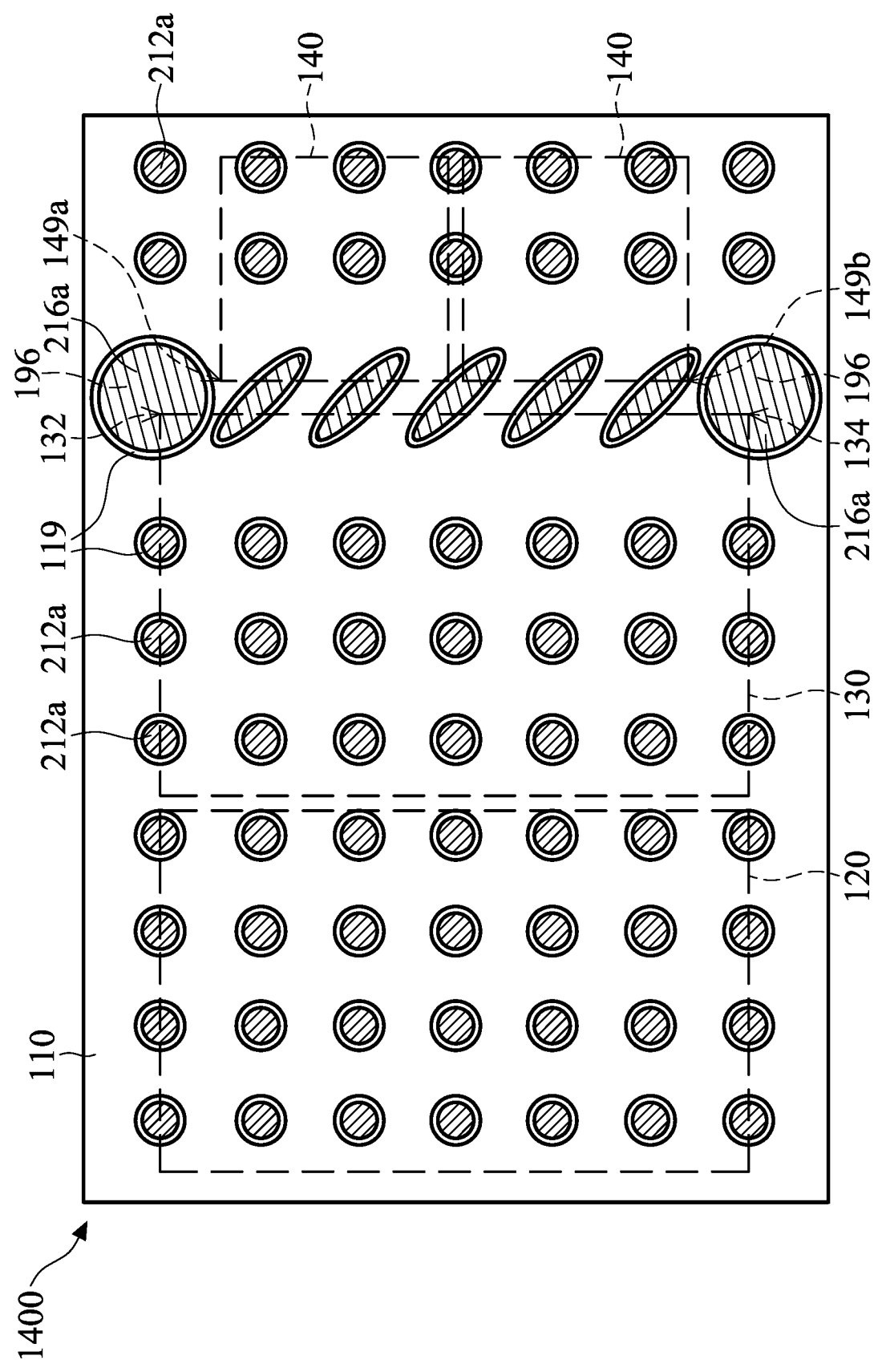
FIG. 14 is a bottom view of a chip package structure, in accordance with some embodiments.

FIG. 14 is a bottom view of a chip package structure 1400, in accordance with some embodiments. As shown in FIG. 14, the chip package structure 1400 is similar to the chip package structure 100 of FIG. 2, except that each anti-warpage bump 196 and each solder ball 216a of the chip package structure 1400 are only under the corner 132 or 134 of the chip structure 130, in accordance with some embodiments. The anti-warpage bump 196 and the solder ball 216a of the chip package structure 1400 are not under the corners 149a and 149b of the chip structures 140, in accordance with some embodiments.

Figure 15:
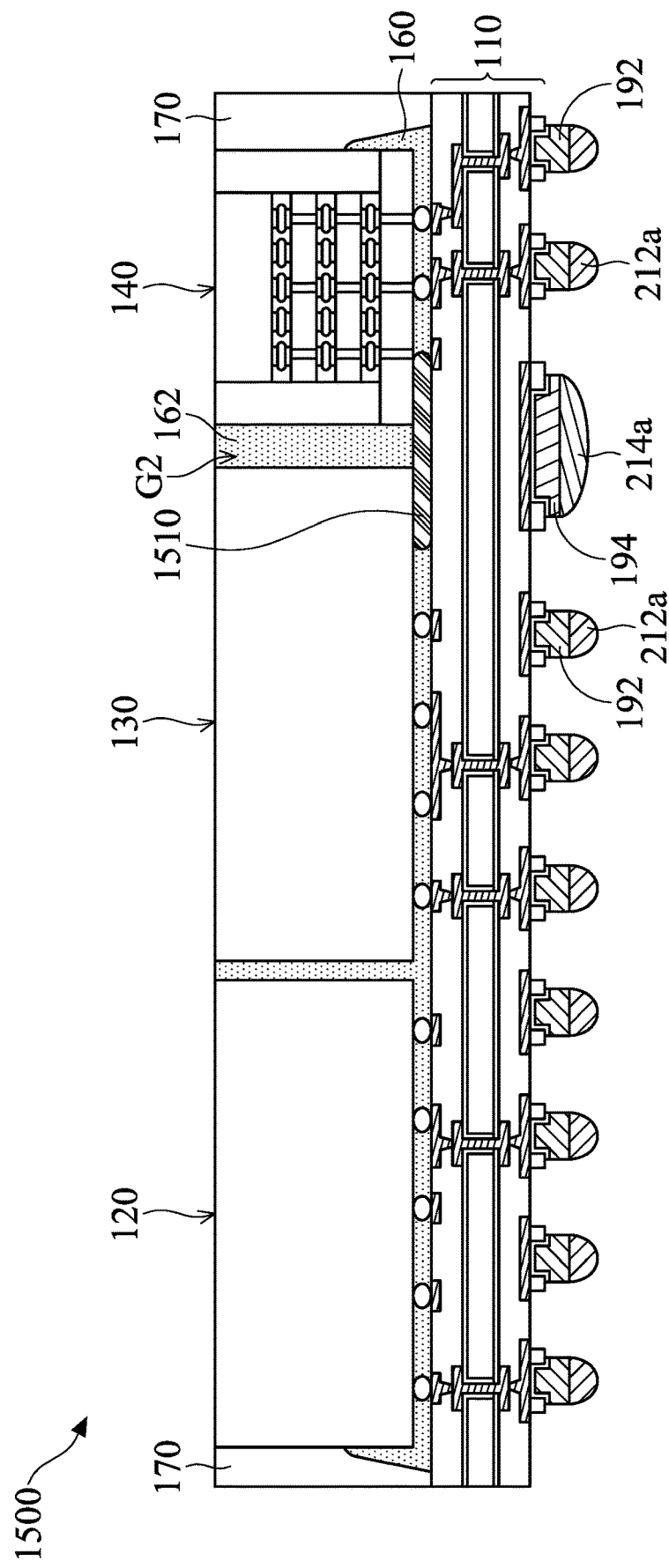
FIG. 15 is a cross-sectional view of a chip package structure, in accordance with some embodiments.

FIG. 15 is a cross-sectional view of a chip package structure 1500, in accordance with some embodiments. As shown in FIG. 15, the chip package structure 1500 is similar to the chip package structure 100 of FIG. 1E, except that the chip package structure 1500 further includes anti-warpage bumps 1510, in accordance with some embodiments. Each anti-warpage bump 1510 is between the chip structure 130 and the substrate 110, between the portion 162 of the underfill layer 160 and the substrate 110, and between the chip structure 140 and the substrate 110, in accordance with some embodiments.

The anti-warpage bump 1510 extends from the chip structure 130 to the chip structure 140, in accordance with some embodiments. The anti-warpage bump 1510 extends across the portion 162 of the underfill layer 160 and the gap G2 between the chip structures 130 and 140, in accordance with some embodiments. The anti-warpage bump 1510 is right over the anti-warpage bump 194 and the solder ball 214a, in accordance with some embodiments. The anti-warpage bumps 1510 are electrically connected to the chip structures 120, 130, and/or 140, in accordance with some embodiments.

The anti-warpage bumps 1510 have a shape the same as or similar to that of the anti-warpage bumps 194, in accordance with some embodiments. The anti-warpage bumps 1510 have a size the same as or similar to that of the anti-warpage bumps 194, in accordance with some embodiments.

Figure 16:
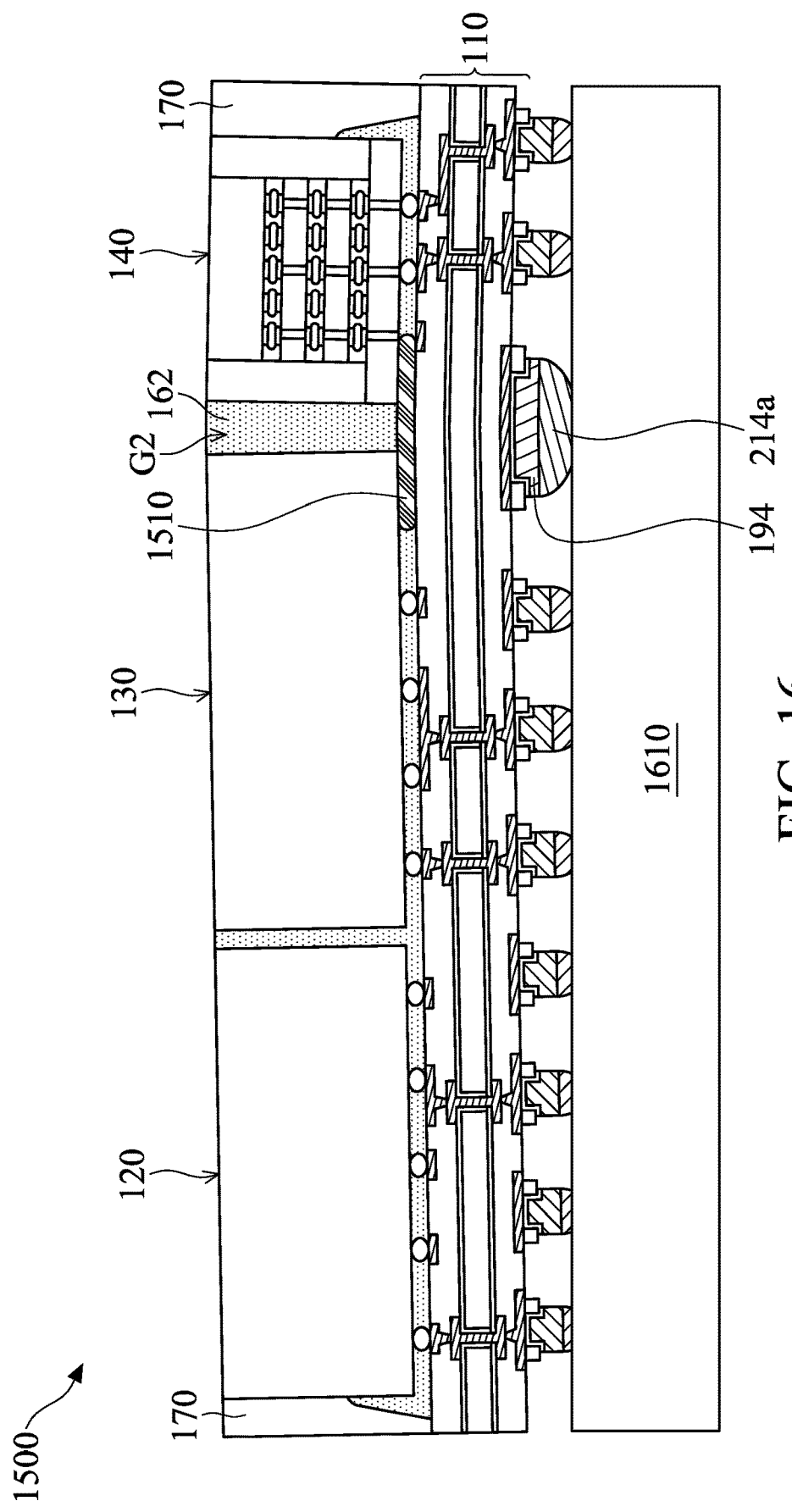
FIG. 16 is a cross-sectional view of a chip package structure, in accordance with some embodiments.

FIG. 16 is a cross-sectional view of a chip package structure, in accordance with some embodiments. As shown in FIG. 16, the chip package structure 1500 of FIG. 15 is bonded to a substrate 1610, in accordance with some embodiments. After bonding the chip package structure 1500 to the substrate 1610, the chip package structure 1500 may be slightly warped along the gap G2 between the chip structures 130 and 140. The anti-warpage bumps 194 and 1510 and the substrate 110 may be slightly warped, in accordance with some embodiments. The substrate 1610 may be a wiring substrate or an interposer substrate.

Figure 17:
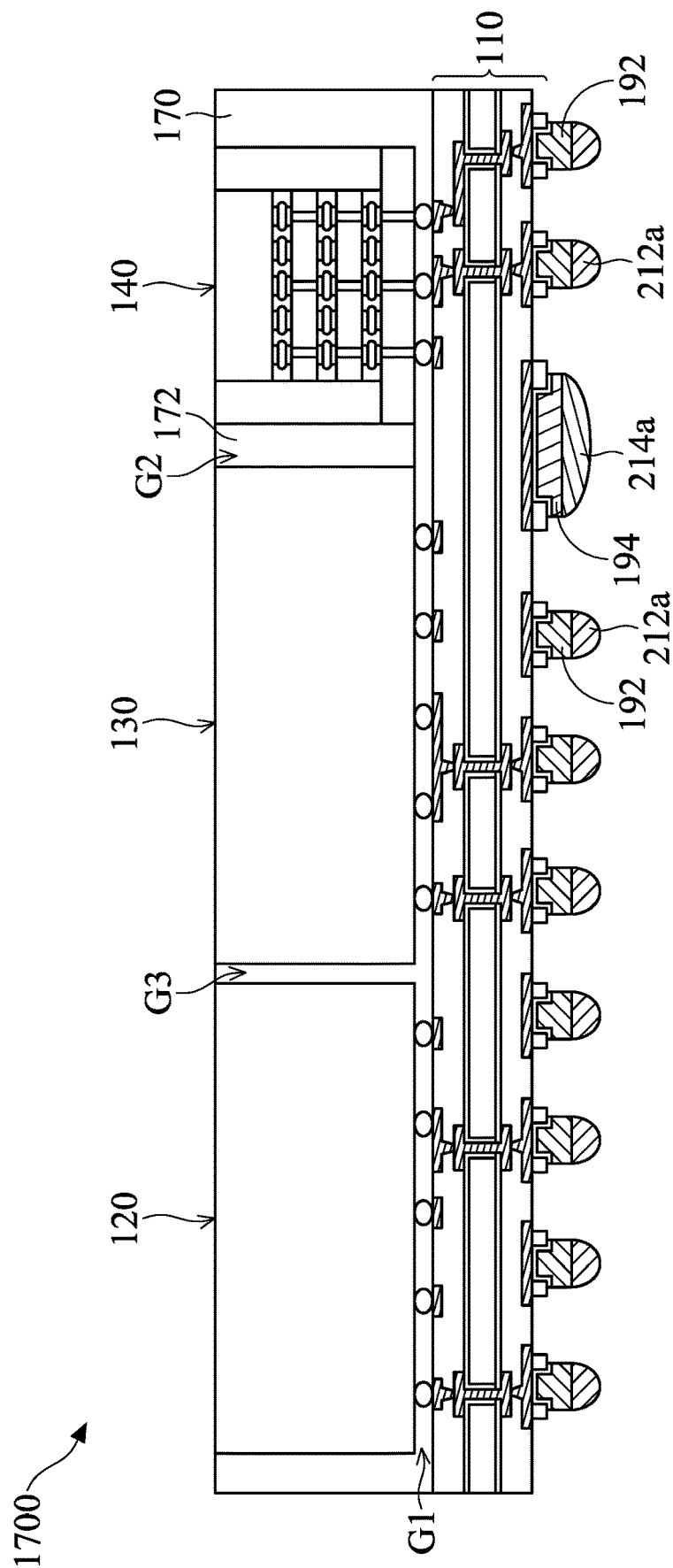
FIG. 17 is a cross-sectional view of a chip package structure, in accordance with some embodiments.

FIG. 17 is a cross-sectional view of a chip package structure 1700, in accordance with some embodiments. As shown FIG. 17, the chip package structure 1700 is similar to the chip package structure 100 of FIG. 1E, except that the chip package structure 1700 does not include the underfill layer 160, in accordance with some embodiments.

The molding layer 170 surrounds the chip structures 120, 130, and 140, in accordance with some embodiments. The molding layer 170 is filled into the gap G1 (between the substrate 110 and each of the chip structures 120, 130, and 140), the gap G2 (between the chip structures 130 and 140), and the gap G3 (between the chip structures 120 and 130), in accordance with some embodiments.

The molding layer 170 is referred to as a protective layer, in accordance with some embodiments. The anti-warpage bumps 194 and the solder balls 214a extend across the portion 172 of the molding layer 170 in the gap G2, in accordance with some embodiments.

Figure 18:
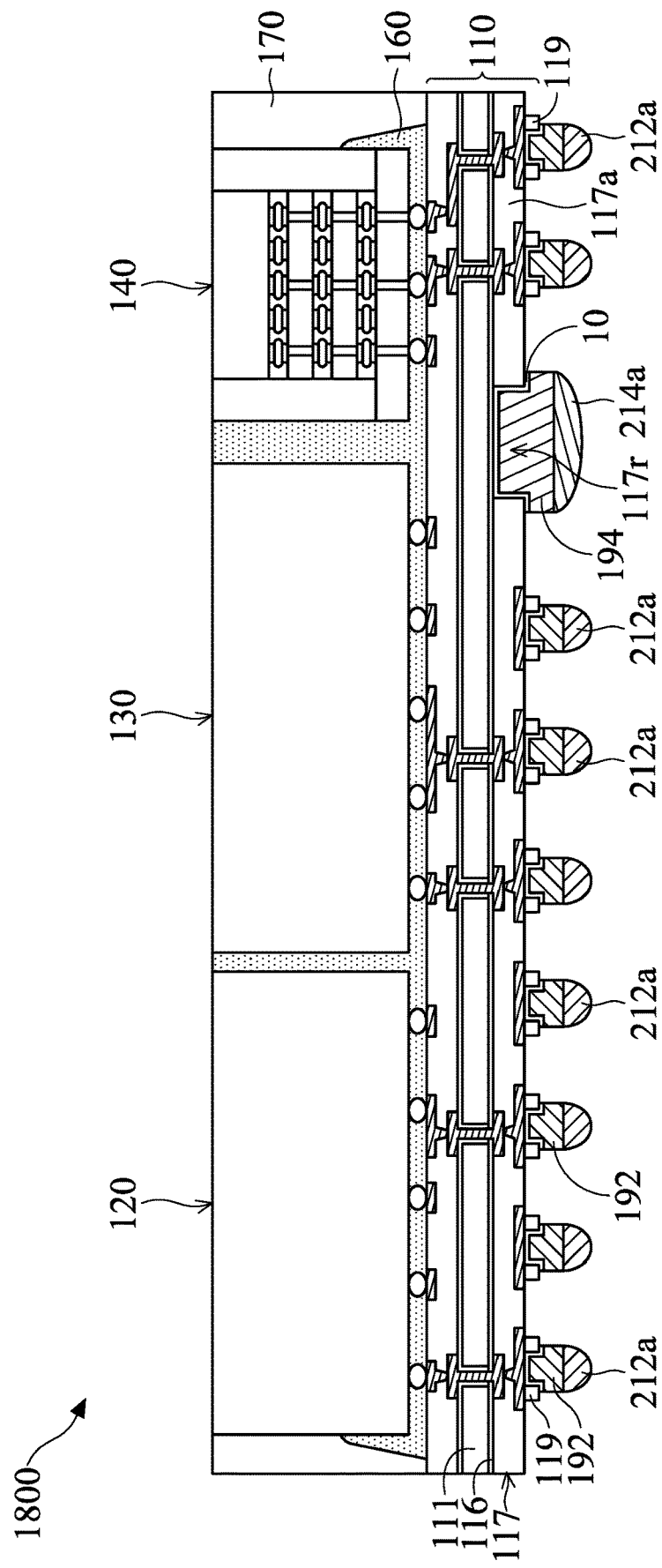
FIG. 18 is a cross-sectional view of a chip package structure, in accordance with some embodiments.

FIG. 18 is a cross-sectional view of a chip package structure 1800, in accordance with some embodiments. As shown FIG. 18, the chip package structure 1800 is similar to the chip package structure 100 of FIG. 1E, except that the dielectric layer 117a of the redistribution structure 117 of the chip package structure 1800 has through holes 117r, in accordance with some embodiments.

The through holes 117r partially expose the insulating layer 116, in accordance with some embodiments. The through holes 117r are formed after forming the dielectric layer 117a and before forming the seed layer 10, in accordance with some embodiments. The seed layer 10 is formed over the bottom surface and the inner walls of the through holes 117r, in accordance with some embodiments. The anti-warpage bumps 194 are formed in and over the through holes 117r, in accordance with some embodiments. The solder balls 214a are formed over the anti-warpage bumps 194, in accordance with some embodiments.

Since the anti-warpage bumps 194 are connected to the semiconductor structure 111 without through the dielectric layer 117a, the anti-warpage bumps 194 reduce the warpage of the substrate 110 more effectively, in accordance with some embodiments.

Figure 19:
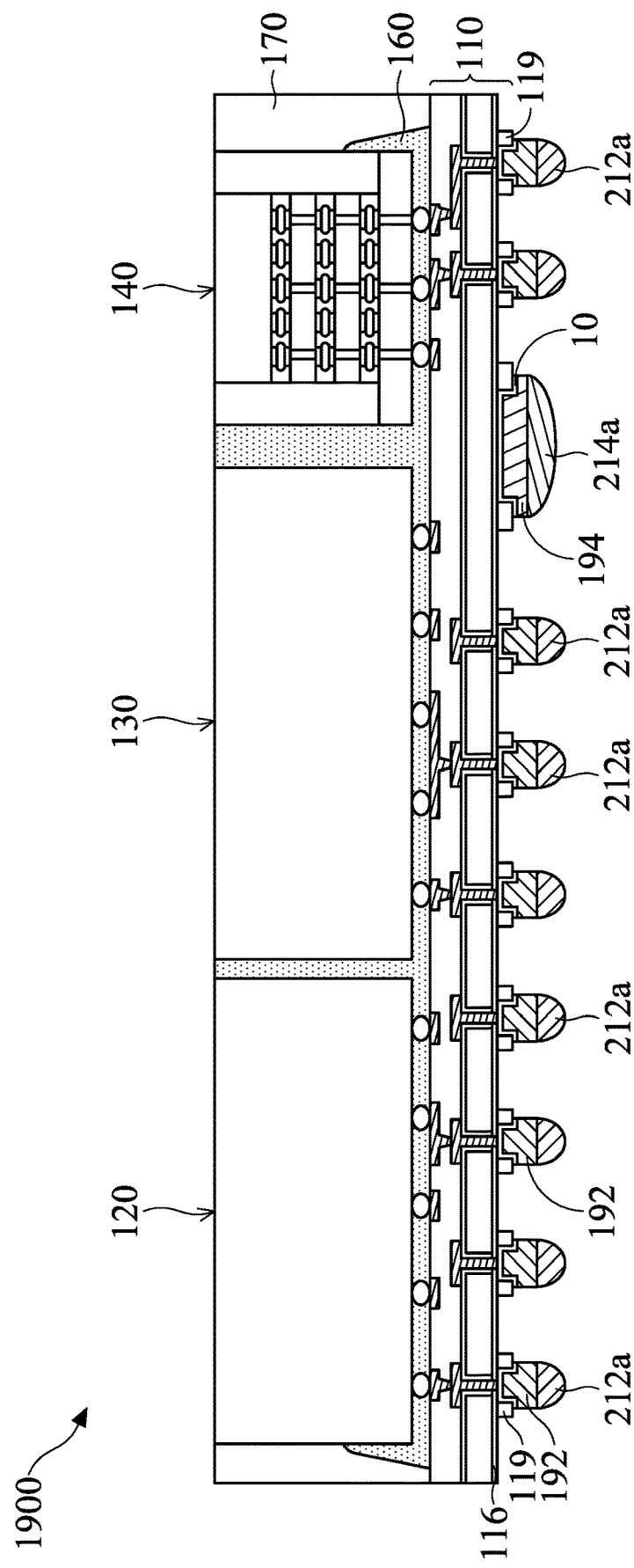
FIG. 19 is a cross-sectional view of a chip package structure, in accordance with some embodiments.

FIG. 19 is a cross-sectional view of a chip package structure 1900, in accordance with some embodiments. As shown FIG. 19, the chip package structure 1900 is similar to the chip package structure 100 of FIG. 1E, except that the chip package structure 1900 does not include the redistribution structure 117 and the conductive pads 118a and 118b of the chip package structure 100 of FIG. 1E, in accordance with some embodiments. The buffer rings 119 and the seed layer 10 are directly formed over the insulating layer 116, in accordance with some embodiments.

In accordance with some embodiments, chip package structures are provided. The chip package structure includes anti-warpage bumps under a gap between chip structures to reduce the warpage of a chip package structure including the anti-warpage bumps and the chip structures.

In accordance with some embodiments, a chip package structure is provided. The chip package structure includes a substrate having a first surface and a second surface opposite to the first surface. The chip package structure includes a first chip structure and a second chip structure over the first surface. The chip package structure includes a protective layer over the first surface and surrounding the first chip structure and the second chip structure. A portion of the protective layer is between the first chip structure and the second chip structure. The chip package structure includes a first anti-warpage bump over the second surface and extending across the portion of the protective layer. The chip package structure includes a conductive bump over the second surface and electrically connected to the first chip structure or the second chip structure. The first anti-warpage bump is wider than the conductive bump.

In accordance with some embodiments, a chip package structure is provided. The chip package structure includes a substrate having a first surface and a second surface opposite to the first surface. The chip package structure includes a first chip structure and a second chip structure over the first surface. The chip package structure includes a protective layer over the first surface and surrounding the first chip structure and the second chip structure. A first portion of the protective layer is between the first chip structure and the second chip structure. The chip package structure includes a first anti-warpage bump over the second surface and under a first corner of the first chip structure and a second portion of the protective layer adjacent to the first portion. The first corner is adjacent to the second chip structure. The chip package structure includes a conductive bump over the second surface and electrically connected to the first chip structure or the second chip structure. The first anti-warpage bump is wider than the conductive bump.

In accordance with some embodiments, a chip package structure is provided. The chip package structure includes a substrate having a first surface and a second surface opposite to the first surface. The chip package structure includes a first chip structure and a second chip structure over the first surface. The chip package structure includes a protective layer over the first surface and surrounding the first chip structure and the second chip structure. A portion of the protective layer is between the first chip structure and the second chip structure. The chip package structure includes a first anti-warpage bump over the second surface and extending across the portion of the protective layer. The chip package structure includes a conductive bump over the second surface and electrically connected to the first chip structure or the second chip structure. The first anti-warpage bump is wider than the conductive bump. The chip package structure includes a second anti-warpage bump between the first chip structure and the substrate, between the portion of the protective layer and the substrate, and between the second chip structure and the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure, comprising:
a substrate having a first surface and a second surface opposite to the first surface;
a first chip structure and a second chip structure over the first surface;
a protective layer over the first surface and surrounding the first chip structure and the second chip structure, wherein a portion of the protective layer is between the first chip structure and the second chip structure;
a first anti-warpage bump over the second surface and extending across the portion of the protective layer;
a conductive bump over the second surface and electrically connected to the first chip structure or the second chip structure, wherein the first anti-warpage bump is wider than the conductive bump;
a first solder layer over the first anti-warpage bump, and
a second solder layer over the conductive bump, wherein the first solder layer is thinner than the second solder layer, and wherein the first anti-warpage bump and the first chip structure, the second chip structure and the protective layer are arranged on opposite sides of the substrate.

2. The chip package structure as claimed in claim 1, further comprising:
a protection bump over the second surface and located over a corner of the substrate, wherein the protection bump has an L-shape.

3. The chip package structure as claimed in claim 1, wherein a width of the first anti-warpage bump is greater than a distance between the first chip structure and the second chip structure.

4. The chip package structure as claimed in claim 1, wherein the first anti-warpage bump is electrically connected to the first chip structure or the second chip structure.

5. The chip package structure as claimed in claim 1, wherein the first anti-warpage bump has a rectangular shape, an oval shape, a round shape, an H-shape, or a I-shape.

6. The chip package structure as claimed in claim 1, wherein the first anti-warpage bump is thinner than the conductive bump.

7. The chip package structure as claimed in claim 1, further comprising:
a second anti-warpage bump over the second surface and under a corner of the first chip structure, wherein the corner is adjacent to the second chip structure, and the second anti-warpage bump is wider than the conductive bump.

8. The chip package structure as claimed in claim 7, wherein the second anti-warpage bump has a ring shape, and the second anti-warpage bump surrounds the first chip structure, the second chip structure, the first anti-warpage bump, and the conductive bump.

9. The chip package structure as claimed in claim 7, wherein the second anti-warpage bump has a rectangular shape, an oval shape, a round shape, an H-shape, or a I-shape.

10. The chip package structure as claimed in claim 7, wherein the second anti-warpage bump is wider than the first anti-warpage bump.

11. The chip package structure as claimed in claim 10, wherein the second anti-warpage bump is thinner than the first anti-warpage bump.

12. A chip package structure, comprising:
a substrate having a first surface and a second surface opposite to the first surface;
a first chip structure and a second chip structure over the first surface;
a protective layer over the first surface and surrounding the first chip structure and the second chip structure, wherein a first portion of the protective layer is between the first chip structure and the second chip structure;
a first anti-warpage bump over the second surface and under a first corner of the first chip structure and a second portion of the protective layer adjacent to the first portion, wherein the first corner is adjacent to the second chip structure;
a conductive bump over the second surface and electrically connected to the first chip structure or the second chip structure, wherein the first anti-warpage bump is wider than the conductive bump;
a first solder layer over the first anti-warpage bump, and
a second solder layer over the conductive bump, wherein the first solder layer is thinner than the second solder layer, and wherein the first anti-warpage bump and the first chip structure, the second chip structure and the protective layer are arranged on opposite sides of the substrate.

13. The chip package structure as claimed in claim 12, wherein the first anti-warpage bump is further under a second corner of the second chip structure, and the first anti-warpage bump extends across the first portion of the protective layer.

14. The chip package structure as claimed in claim 12, further comprising:
a second anti-warpage bump over the second surface and extending across the portion of the protective layer, wherein the first anti-warpage bump is wider than the second anti-warpage bump, and the second anti-warpage bump is wider than the conductive bump.

15. The chip package structure as claimed in claim 14, further comprising:
a third anti-warpage bump over the second surface and under a second corner of the first chip structure, wherein the third anti-warpage bump is wider than the second anti-warpage bump, and the first anti-warpage bump, the second anti-warpage bump, and the third anti-warpage bump are arranged in a straight line.

16. The chip package structure as claimed in claim 15, wherein the first anti-warpage bump, the second anti-warpage bump, and the third anti-warpage bump are under a same edge of the first chip structure.

17. A chip package structure, comprising:
a substrate having a first surface and a second surface opposite to the first surface;
a first chip structure and a second chip structure over the first surface;
a protective layer over the first surface and surrounding the first chip structure and the second chip structure, wherein a portion of the protective layer is between the first chip structure and the second chip structure;
a first anti-warpage bump over the second surface and extending across the portion of the protective layer;
a conductive bump over the second surface and electrically connected to the first chip structure or the second chip structure, wherein the first anti-warpage bump is wider than the conductive bump; and
a second anti-warpage bump between the first chip structure and the substrate, between the portion of the protective layer and the substrate, and between the second chip structure and the substrate, and extending across the portion of the protective layer and a gap between the first chip structure and the second chip structure wherein the first anti-warpage bump and the first chip structure, the second chip structure and the protective layer are arranged on opposite sides of the substrate.

18. The chip package structure as claimed in claim 17, wherein the second anti-warpage bump is electrically connected to the first chip structure and the second chip structure.

19. The chip package structure as claimed in claim 17, wherein the second anti-warpage bump extends from the first chip structure to the second chip structure.

20. The chip package structure as claimed in claim 17, wherein the second anti-warpage bump is over the first anti-warpage bump.

* * * * *